US012242685B2

(12) United States Patent
Park et al.

(10) Patent No.: US 12,242,685 B2
(45) Date of Patent: *Mar. 4, 2025

(54) DISPLAY MODULE

(71) Applicant: Samsung Display Co., Ltd., Yongin-si (KR)

(72) Inventors: Yong-hwan Park, Cheonan-si (KR); Miyoung Kim, Daegu (KR); Nayun Kwak, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/519,086

(22) Filed: Nov. 27, 2023

(65) Prior Publication Data

US 2024/0086002 A1 Mar. 14, 2024

Related U.S. Application Data

(63) Continuation of application No. 17/335,322, filed on Jun. 1, 2021, now Pat. No. 11,880,519, which is a (Continued)

(30) Foreign Application Priority Data

Sep. 30, 2016 (KR) .......................... 10-2016-0127047

(51) Int. Cl.
*G06F 3/041* (2006.01)
*G06F 3/044* (2006.01)
(Continued)

(52) U.S. Cl.
CPC ........ *G06F 3/0412* (2013.01); *G06F 3/04164* (2019.05); *H10K 50/805* (2023.02);
(Continued)

(58) Field of Classification Search
CPC ............... G06F 3/0412; H01L 27/3225; H01L 27/3223; H01L 51/52–5296
See application file for complete search history.

(56) References Cited

U.S. PATENT DOCUMENTS 8,791,455 B2 * 7/2014 Kim ...................... H10K 77/111
257/40
8,995,022 B1 * 3/2015 Vronsky ................ H10K 71/70
358/3.06

(Continued)

FOREIGN PATENT DOCUMENTS

CN 104679369 6/2015
CN 104752484 7/2015
(Continued)

OTHER PUBLICATIONS

Non-Final Office Action issued May 3, 2019 in U.S. Appl. No. 15/711,277.
(Continued)

*Primary Examiner* — Patrick F Marinelli
(74) *Attorney, Agent, or Firm* — Womble Bond Dickinson (US) LLP

(57) ABSTRACT

A display module includes a display area and a non-display area disposed outside the display area on a plane. The display module includes a base layer, a circuit device layer, a display device layer, a thin film encapsulation layer, and a touch sensing layer. An inorganic layer of the touch sensing layer contacts an inorganic layer of the circuit device layer exposed by an organic layer of the circuit device layer. An inorganic layer of the thin film encapsulation layer is disposed between the inorganic layer of the touch sensing layer and the inorganic layer of the circuit device layer to block a moisture penetration path which causes delamination of the thin film encapsulation layer.

14 Claims, 25 Drawing Sheets

Related U.S. Application Data continuation of application No. 15/711,277, filed on Sep. 20, 2017, now Pat. No. 11,061,498.

(51) Int. Cl.
*H10K 50/805* (2023.01)
*H10K 50/842* (2023.01)
*H10K 59/40* (2023.01)

(52) U.S. Cl.
CPC ........... *H10K 59/40* (2023.02); *G06F 3/0443* (2019.05); *G06F 3/0446* (2019.05); *H10K 50/8426* (2023.02)

(56) References Cited

U.S. PATENT DOCUMENTS

| | | | | |
|---|---|---|---|---|
| 9,046,955 | B1* | 6/2015 | Lee | G02F 1/13338 |
| 9,065,073 | B2* | 6/2015 | Choi | H10K 59/122 |
| 9,431,629 | B2* | 8/2016 | Moon | H10K 77/111 |
| 9,501,165 | B2 | 11/2016 | Kim et al. | |
| 9,576,520 | B2* | 2/2017 | Park | H01L 27/1218 |
| 9,601,717 | B2* | 3/2017 | Lee | H10K 50/8445 |
| 9,608,215 | B2* | 3/2017 | Minami | H10K 59/131 |
| 9,614,183 | B2* | 4/2017 | Zhang | H10K 59/12 |
| 9,647,233 | B2 | 5/2017 | Kim et al. | |
| 9,647,241 | B2* | 5/2017 | Lee | H10K 59/121 |
| 9,720,449 | B2 | 8/2017 | Ko et al. | |
| 9,755,181 | B2* | 9/2017 | Odaka | H10K 50/8426 |
| 9,818,807 | B2* | 11/2017 | Park | H10K 59/122 |
| 9,891,735 | B2* | 2/2018 | Bae | G06F 3/0443 |
| 9,905,629 | B2* | 2/2018 | Kim | H10K 59/8722 |
| 9,905,630 | B2* | 2/2018 | Lee | H10K 59/124 |
| 9,905,801 | B2* | 2/2018 | Kim | H01L 27/124 |
| 9,923,167 | B2* | 3/2018 | Choi | H10K 59/8052 |
| 9,928,768 | B2* | 3/2018 | Kim | H10K 59/873 |
| 9,954,200 | B2* | 4/2018 | Kim | H10K 59/131 |
| 9,983,714 | B2* | 5/2018 | Ahn | H10K 59/8793 |
| 9,991,465 | B2* | 6/2018 | Jeon | H10K 59/8731 |
| 9,997,427 | B2* | 6/2018 | Chen | H01L 27/124 |
| 10,014,491 | B2* | 7/2018 | Park | H10K 59/8722 |
| 10,050,100 | B2* | 8/2018 | Lee | H10K 59/1315 |
| 10,050,228 | B2* | 8/2018 | Zhang | H10K 59/124 |
| 10,056,444 | B2* | 8/2018 | Cho | H10K 59/1216 |
| 10,068,954 | B2* | 9/2018 | Kim | H10K 59/8722 |
| 10,088,715 | B2* | 10/2018 | Yeh | G06F 3/0443 |
| 10,109,686 | B2* | 10/2018 | Oh | G06F 3/0412 |
| 10,115,913 | B2* | 10/2018 | Namkung | H10K 59/12 |
| 10,135,010 | B2* | 11/2018 | Kim | H10K 77/10 |
| 10,135,026 | B2* | 11/2018 | Moon | H10K 59/873 |
| 10,199,602 | B2* | 2/2019 | Choi | H10K 59/8052 |
| 10,205,125 | B2* | 2/2019 | Cai | H10K 71/00 |
| 10,224,383 | B2* | 3/2019 | Park | H10K 50/84 |
| 10,229,933 | B2* | 3/2019 | Seo | H01L 27/1262 |
| 10,263,217 | B2* | 4/2019 | Lee | H10K 50/846 |
| 10,276,646 | B2* | 4/2019 | Kim | H10K 50/844 |
| 10,276,823 | B2* | 4/2019 | Jin | H10K 59/8731 |
| 10,276,831 | B2* | 4/2019 | Lee | H10K 59/131 |
| 10,303,277 | B2* | 5/2019 | Choi | H10K 59/131 |
| 10,304,921 | B2* | 5/2019 | Lee | H10K 59/1213 |
| 10,319,938 | B2* | 6/2019 | Choi | H01L 27/124 |
| 10,325,972 | B2* | 6/2019 | Park | H10K 59/873 |
| 10,326,102 | B2* | 6/2019 | Park | H10K 59/352 |
| 10,347,866 | B1* | 7/2019 | Kim | H10K 50/8445 |
| 10,374,160 | B2* | 8/2019 | Tanaka | H10K 59/124 |
| 10,386,956 | B2* | 8/2019 | Gwon | G06F 3/0412 |
| 10,396,310 | B2* | 8/2019 | Choi | H10K 59/8731 |
| 10,642,394 | B2* | 5/2020 | Song | H10K 59/131 |
| 10,658,434 | B2* | 5/2020 | Song | G06F 3/0412 |
| 11,061,498 | B2* | 7/2021 | Park | H10K 59/8731 |
| 11,880,519 | B2* | 1/2024 | Park | G06F 3/0412 |
| 2004/0207315 | A1* | 10/2004 | Robbie | G09G 3/3216 313/504 |
| 2005/0184927 | A1* | 8/2005 | Kwak | H10K 59/131 345/45 |
| 2006/0040739 | A1* | 2/2006 | Wells | G07F 17/3211 463/37 |
| 2007/0181872 | A1* | 8/2007 | Lee | H10K 59/122 257/40 |
| 2009/0109172 | A1* | 4/2009 | Lee | G09G 3/344 345/107 |
| 2013/0248826 | A1* | 9/2013 | Kim | H10K 59/12 257/40 |
| 2014/0097408 | A1* | 4/2014 | Kim | H10K 59/131 257/40 |
| 2014/0117316 | A1* | 5/2014 | Choi | H10K 59/122 438/26 |
| 2014/0132148 | A1* | 5/2014 | Jang | H10K 50/8445 313/504 |
| 2014/0145979 | A1* | 5/2014 | Lee | H10K 59/40 345/173 |
| 2014/0183473 | A1* | 7/2014 | Lee | H10K 50/844 257/40 |
| 2014/0232956 | A1* | 8/2014 | Kwon | H01L 27/124 349/12 |
| 2014/0301044 | A1* | 10/2014 | Oh | G06F 1/1652 361/749 |
| 2014/0306941 | A1* | 10/2014 | Kim | H10K 77/111 345/204 |
| 2015/0179099 | A1* | 6/2015 | Go | H10K 50/8428 345/82 |
| 2015/0185915 | A1* | 7/2015 | Lim | G06F 3/0445 427/79 |
| 2015/0185942 | A1* | 7/2015 | Kim | H10K 59/40 345/173 |
| 2015/0380467 | A1* | 12/2015 | Su | H10K 59/122 257/40 |
| 2015/0380685 | A1* | 12/2015 | Lee | H10K 59/8731 257/40 |
| 2015/0382446 | A1* | 12/2015 | Kwon | G06F 1/1643 174/251 |
| 2016/0043342 | A1* | 2/2016 | Lee | G06F 1/1652 257/40 |
| 2016/0043348 | A1* | 2/2016 | Zhang | H10K 59/12 257/40 |
| 2016/0062520 | A1* | 3/2016 | Choi | G06F 3/0412 345/174 |
| 2016/0064686 | A1* | 3/2016 | Odaka | H10K 50/8426 257/89 |
| 2016/0079564 | A1 | 3/2016 | Shim et al. | |
| 2016/0103537 | A1 | 4/2016 | Park et al. | |
| 2016/0154499 | A1* | 6/2016 | Bae | G06F 3/0446 345/174 |
| 2016/0179229 | A1* | 6/2016 | Ahn | G06F 3/0447 345/173 |
| 2016/0190503 | A1* | 6/2016 | Chang | H10K 77/10 257/40 |
| 2016/0190521 | A1* | 6/2016 | Lee | H10K 50/19 257/40 |
| 2016/0204373 | A1* | 7/2016 | Park | H10K 59/873 257/40 |
| 2016/0204374 | A1 | 7/2016 | Sonada et al. | |
| 2016/0231846 | A1 | 8/2016 | Kim et al. | |
| 2016/0260928 | A1* | 9/2016 | Choi | H10K 59/8052 |
| 2016/0284770 | A1 | 9/2016 | Kim | |
| 2016/0285045 | A1* | 9/2016 | Park | H10K 59/873 |
| 2016/0293884 | A1* | 10/2016 | Zhang | H10K 59/124 |
| 2016/0306472 | A1* | 10/2016 | Park | H10K 59/8731 |
| 2016/0307971 | A1* | 10/2016 | Jeon | H01L 22/30 |
| 2016/0315284 | A1* | 10/2016 | Jeon | H10K 50/8445 |
| 2016/0336541 | A1* | 11/2016 | Kim | H10K 50/8445 |
| 2017/0033312 | A1* | 2/2017 | Kim | H10K 59/873 |
| 2017/0040347 | A1* | 2/2017 | Seo | H01L 29/78603 |
| 2017/0053973 | A1* | 2/2017 | Park | H10K 50/844 |
| 2017/0062773 | A1* | 3/2017 | Lee | H10K 59/128 |
| 2017/0110532 | A1* | 4/2017 | Kim | H10K 50/8445 |
| 2017/0117502 | A1* | 4/2017 | Park | H10K 50/8426 |
| 2017/0125734 | A1* | 5/2017 | Lee | H10K 59/8722 |
| 2017/0170247 | A1* | 6/2017 | Kim | H10K 59/8723 |
| 2017/0244061 | A1* | 8/2017 | Jin | H10K 59/8731 |
| 2017/0277288 | A1* | 9/2017 | Choi | G06F 3/0412 |
| 2017/0278901 | A1* | 9/2017 | Kim | G06F 3/0412 |

(56) References Cited

U.S. PATENT DOCUMENTS

| | | | | |
|---|---|---|---|---|
| 2017/0287995 | A1* | 10/2017 | Kim | H10K 59/124 |
| 2017/0288004 | A1* | 10/2017 | Kim | H10K 59/124 |
| 2017/0294501 | A1* | 10/2017 | Jang | H10K 59/122 |
| 2017/0294609 | A1* | 10/2017 | Namkung | H10K 77/111 |
| 2017/0323779 | A1* | 11/2017 | Um | H01L 27/1262 |
| 2017/0323936 | A1* | 11/2017 | Lee | H10K 59/1216 |
| 2017/0331058 | A1* | 11/2017 | Seo | H10K 50/8445 |
| 2017/0371463 | A1* | 12/2017 | Choi | H10K 59/131 |
| 2017/0373128 | A1* | 12/2017 | Lee | H10K 59/124 |
| 2018/0006265 | A1* | 1/2018 | Oh | H10K 71/231 |
| 2018/0013092 | A1* | 1/2018 | Park | H10K 59/873 |
| 2018/0026225 | A1* | 1/2018 | Kwon | H10K 59/87 257/40 |
| 2018/0026226 | A1* | 1/2018 | Choi | H10K 59/873 257/552 |
| 2018/0032189 | A1* | 2/2018 | Lee | G09G 3/3266 |
| 2018/0033829 | A1* | 2/2018 | Oh | H10K 59/40 |
| 2018/0033830 | A1* | 2/2018 | Kim | H10K 59/873 |
| 2018/0033831 | A1* | 2/2018 | An | G06F 3/0446 |
| 2018/0033832 | A1 | 2/2018 | Park et al. | |
| 2018/0033998 | A1* | 2/2018 | Kim | H10K 59/12 |
| 2018/0040672 | A1* | 2/2018 | Park | G06F 3/0412 |
| 2018/0047920 | A1* | 2/2018 | Jang | H10K 77/111 |
| 2018/0053810 | A1* | 2/2018 | Jin | H10K 59/8731 |
| 2018/0059855 | A1* | 3/2018 | Gwon | G06F 3/04166 |
| 2018/0059862 | A1* | 3/2018 | Zeng | H10K 59/873 |
| 2018/0061722 | A1* | 3/2018 | Byun | H10K 59/121 |
| 2018/0061728 | A1* | 3/2018 | Chen | H10K 50/844 |
| 2018/0061897 | A1* | 3/2018 | Oh | G06F 3/0443 |
| 2018/0061898 | A1* | 3/2018 | Oh | H10K 59/873 |
| 2018/0061899 | A1* | 3/2018 | Oh | H10K 59/8722 |
| 2018/0061910 | A1* | 3/2018 | Cai | H10K 59/873 |
| 2018/0068919 | A1* | 3/2018 | Chung | H10K 59/8731 |
| 2018/0088726 | A1* | 3/2018 | Gwon | G06F 3/041 |
| 2018/0090547 | A1* | 3/2018 | Shin | H10K 59/35 |
| 2018/0095567 | A1* | 4/2018 | Lee | G06F 3/0412 |
| 2018/0095571 | A1* | 4/2018 | Park | H10K 59/8722 |
| 2018/0095581 | A1* | 4/2018 | Hwang | H10K 59/12 |
| 2018/0095584 | A1* | 4/2018 | Lee | H10K 50/805 |
| 2018/0097034 | A1* | 4/2018 | Lee | H01L 23/08 |
| 2018/0097200 | A1* | 4/2018 | Park | H10K 59/873 |
| 2018/0102502 | A1* | 4/2018 | Kim | H01L 22/12 |
| 2018/0108867 | A1* | 4/2018 | Lee | H10K 50/8445 |
| 2018/0113545 | A1* | 4/2018 | Shim | G06F 3/0412 |
| 2018/0122864 | A1* | 5/2018 | Lee | H10K 50/86 |
| 2018/0129352 | A1* | 5/2018 | Kim | G06F 3/0446 |
| 2018/0136527 | A1* | 5/2018 | Park | H10K 50/14 |
| 2018/0138450 | A1* | 5/2018 | Park | H10K 59/8731 |
| 2018/0166525 | A1* | 6/2018 | Kim | G01N 27/20 |
| 2018/0175116 | A1* | 6/2018 | Song | G06F 3/0412 |
| 2018/0183003 | A1* | 6/2018 | Han | H01L 27/1248 |
| 2018/0188186 | A1* | 7/2018 | Yang | G01N 21/94 |
| 2018/0188584 | A1* | 7/2018 | Yeh | G02F 1/1337 |
| 2018/0188614 | A1* | 7/2018 | Yeh | G02F 1/1368 |
| 2018/0188867 | A1* | 7/2018 | Yeh | G06F 3/0443 |
| 2018/0190742 | A1* | 7/2018 | He | H10K 59/131 |
| 2018/0198092 | A1* | 7/2018 | Choi | H10K 59/8051 |
| 2018/0205037 | A1* | 7/2018 | Kim | H10K 59/873 |
| 2018/0226454 | A1* | 8/2018 | Liu | H10K 59/124 |
| 2018/0226483 | A1* | 8/2018 | Kim | H01L 29/45 |
| 2018/0226610 | A1* | 8/2018 | Moon | H10K 59/131 |
| 2018/0226612 | A1* | 8/2018 | Choi | H10K 50/844 |
| 2018/0254435 | A1* | 9/2018 | Sasaki | H10K 50/846 |
| 2018/0269261 | A1* | 9/2018 | Park | G06F 3/0412 |
| 2018/0270950 | A1* | 9/2018 | Park | H10K 59/123 |
| 2018/0286938 | A1* | 10/2018 | Moon | H10K 77/111 |
| 2018/0287093 | A1* | 10/2018 | Lee | H10K 59/122 |
| 2018/0315809 | A1* | 11/2018 | Kim | H10K 77/111 |
| 2018/0329552 | A1* | 11/2018 | Song | G06F 3/044 |
| 2018/0342565 | A1* | 11/2018 | Cheng | G09G 3/3225 |
| 2018/0348913 | A1* | 12/2018 | Lee | G06F 3/0412 |
| 2018/0351126 | A1* | 12/2018 | Choi | H10K 59/122 |
| 2018/0356898 | A1* | 12/2018 | Galor | G06F 3/0304 |
| 2018/0366520 | A1* | 12/2018 | Gwon | H10K 59/124 |
| 2018/0366529 | A1* | 12/2018 | Lee | H10K 59/1213 |
| 2018/0366531 | A1* | 12/2018 | Kato | H01L 27/1248 |
| 2018/0366586 | A1* | 12/2018 | Son | H01L 27/1218 |
| 2018/0373372 | A1* | 12/2018 | Kim | H10K 59/873 |
| 2019/0004654 | A1* | 1/2019 | Gwon | G06F 3/044 |
| 2019/0019966 | A1* | 1/2019 | Jiang | H10K 59/124 |
| 2019/0019985 | A1* | 1/2019 | Cai | H10K 71/00 |
| 2019/0036063 | A1* | 1/2019 | Lee | G06F 3/0443 |
| 2019/0058021 | A1* | 2/2019 | Kim | H10K 59/122 |
| 2019/0058121 | A1* | 2/2019 | Tanaka | H05B 33/04 |
| 2019/0074459 | A1* | 3/2019 | Kim | H10K 71/231 |
| 2019/0074481 | A1* | 3/2019 | Kim | H10K 50/844 |
| 2019/0081129 | A1* | 3/2019 | Sung | H10K 59/873 |
| 2019/0088894 | A1* | 3/2019 | Park | H10K 59/18 |
| 2019/0095018 | A1* | 3/2019 | Shin | H10K 50/86 |
| 2019/0096975 | A1* | 3/2019 | Park | H10K 59/873 |
| 2019/0097162 | A1* | 3/2019 | Wang | H10K 71/70 |
| 2019/0103443 | A1* | 4/2019 | Kim | H10K 59/40 |
| 2019/0103457 | A1* | 4/2019 | Shin | H10K 50/844 |
| 2019/0129551 | A1* | 5/2019 | Lee | G02F 1/1345 |
| 2019/0131354 | A1* | 5/2019 | Lee | G06F 3/0446 |
| 2019/0131379 | A1* | 5/2019 | Won | H10K 50/844 |
| 2019/0131562 | A1* | 5/2019 | Rhe | H10K 50/844 |
| 2019/0131572 | A1* | 5/2019 | Gwon | H10K 50/8426 |
| 2019/0157618 | A1* | 5/2019 | Park | H10K 59/874 |
| 2019/0181373 | A1* | 6/2019 | Kim | H10K 59/122 |
| 2019/0189956 | A1* | 6/2019 | Park | H10K 50/8426 |
| 2019/0196619 | A1* | 6/2019 | Baek | G06F 3/04166 |
| 2019/0198587 | A1* | 6/2019 | Park | H10K 59/8731 |
| 2019/0207157 | A1* | 7/2019 | Gong | H10K 59/122 |
| 2019/0214446 | A1* | 7/2019 | Kim | H10K 50/8445 |
| 2019/0221634 | A1* | 7/2019 | Kim | H10K 59/122 |
| 2019/0229175 | A1* | 7/2019 | Lhee | H10K 59/131 |
| 2019/0229289 | A1* | 7/2019 | Kim | H10K 71/00 |
| 2019/0237690 | A1* | 8/2019 | Park | H10K 71/621 |
| 2019/0245020 | A1* | 8/2019 | Choi | H01L 21/28 |
| 2019/0245028 | A1* | 8/2019 | Lee | H10K 59/131 |
| 2019/0258297 | A1* | 8/2019 | Choi | G06F 1/1652 |
| 2021/0294447 | A1* | 9/2021 | Park | H10K 59/40 |
| 2024/0086002 | A1* | 3/2024 | Park | H10K 59/8722 |

FOREIGN PATENT DOCUMENTS

| | | |
|---|---|---|
| CN | 105280677 | 1/2016 |
| CN | 205539836 | 8/2016 |
| CN | 105957874 | 9/2016 |
| EP | 2939285 | 11/2015 |
| EP | 2960962 | 12/2015 |
| KR | 10-2016-0000853 | 1/2016 |
| KR | 10-2016-0043230 | 4/2016 |
| KR | 10-2016-0065436 | 6/2016 |
| KR | 10-1679402 | 11/2016 |
| KR | 10-2018-0014385 | 2/2018 |
| KR | 10-2018-0015326 | 2/2018 |

OTHER PUBLICATIONS

Final Office Action issued Sep. 12, 2019 in U.S. Appl. No. 15/711,277.
Non-Final Office Action issued Jan. 13, 2020 in U.S. Appl. No. 15/711,277.
Final Office Action issued Apr. 16, 2020 in U.S. Appl. No. 15/711,277.
Notice of Allowance issued Feb. 8, 2021 in U.S. Appl. No. 15/711,277.
Non-Final Office Action dated Apr. 24, 2023, issued to U.S. Appl. No. 17/335,322.
Notice of Allowance dated Sep. 1, 2023, issued to U.S. Appl. No. 17/335,322.

* cited by examiner

DISPLAY MODULE

CROSS-REFERENCE TO RELATED APPLICATIONS

This application is a Continuation of U.S. patent application Ser. No. 17/335,322, filed on Jun. 1, 2021, which is a Continuation of U.S. patent application Ser. No. 15/711,277, filed Sep. 21, 2017, issued as U.S. Pat. No. 11,029,773, and claims priority from and the benefit of Korean Patent Application No. 10-2016-0127047, filed on Sep. 30, 2016, each of which is hereby incorporated by reference for all purposes as if fully set forth herein.

BACKGROUND

Field

Exemplary embodiments relate to a display module. More particularly, exemplary embodiments relate to a display panel with a touch sensing unit integrated therein.

Discussion of the Background

Various display apparatuses used in multimedia devices such as televisions, mobile phones, table computers, navigation devices, and game consoles are being developed. Such a display apparatus may include a keyboard or a mouse as an input unit. Also, in recent years, display apparatuses have begun including a touch panel as an input unit.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display module in which the number of defects is reduced.

Additional aspects will be set forth in the detailed description which follows, and, in part, will be apparent from the disclosure, or may be learned by practice of the inventive concept.

An exemplary embodiment of the inventive concept provides a display module including a base layer, a circuit device layer disposed on the base layer, a display device layer disposed on the circuit device layer, a thin film encapsulation layer, and a touch sensing layer. The base layer includes a display area and a non-display area disposed outside the display area. The circuit device layer includes an intermediate inorganic layer overlapping the display area and the non-display area, an intermediate organic layer disposed on the intermediate inorganic layer to expose a portion of the intermediate inorganic layer within the non-display area, and a circuit device. The display device layer includes display devices disposed on the display area. The thin film encapsulation layer includes a first encapsulation inorganic layer including a first region overlapping the display area and a second region overlapping the non-display area and having a thickness less than that of the first region. The touch sensing layer includes a plurality of touch electrodes and a inorganic touch layer overlapping the display area and the non-display area and contacting the intermediate inorganic layer exposed by the intermediate organic layer.

In an embodiment, an edge of the intermediate organic layer may be disposed inside an edge of the intermediate inorganic layer on a top surface of the base layer.

In an embodiment, the thickness of the second region may become smaller as a distance from the first region increases.

In an embodiment, the display module may further include a first protrusion part disposed outside an edge of the intermediate organic layer and extending along the edge of the intermediate organic layer. The first protrusion part may surround the edge of the intermediate organic layer.

In an embodiment, the circuit device may include signal lines electrically connected to the display devices and signal pads connected to ends of the signal lines. The signal pads are aligned in the non-display area.

In an embodiment, a portion of the first protrusion part may be parallel to the aligned signal pads.

In an embodiment, the display module may further include a second protrusion part disposed between the portion of the first protrusion part and the aligned signal pads and be parallel to the portion of the first protrusion part.

In an embodiment, the first protrusion part and the second protrusion part may be disposed on the intermediate inorganic layer, and the second protrusion part may have a height greater than that of the first protrusion part. The first encapsulation inorganic layer may overlap the first protrusion part and the second protrusion part.

In an embodiment, the display module may further include an outer organic layer connected to the second protrusion part, spaced apart from the intermediate organic layer, and disposed between the display area and the aligned signal pads.

In an embodiment, an edge of the outer organic layer may be disposed inside an edge of the inorganic touch layer, and the edge of the inorganic touch layer may be disposed inside the edge of the intermediate inorganic layer.

In an embodiment, a portion of the first encapsulation inorganic layer, which does not overlap the outer organic layer, may be disposed between the intermediate inorganic layer and the inorganic touch layer to contact the intermediate inorganic layer and the inorganic touch layer.

In an embodiment, the non-display area may include a first non-bending area, a second non-bending area spaced apart from the first non-bending area in a first direction, and a bending area defined between the first non-bending area and the second non-bending area.

In an embodiment, the bending area may be bent so that a bending axis is defined in a second direction perpendicular to the first direction.

In an embodiment, the intermediate inorganic layer may have a groove through which a portion of the non-display area of the base layer is exposed, and a dummy organic pattern may be disposed inside the groove.

In an embodiment, the display module may further include inorganic material lines disposed outside an edge of the intermediate inorganic layer to extend along the edge of the intermediate inorganic layer. The inorganic touch layer may be spaced apart from the inorganic material lines.

In an embodiment, the touch sensing layer may further include a touch organic layer disposed on the inorganic touch layer to cover the touch electrodes. The touch organic layer may overlap the inorganic material lines.

In an embodiment, the thin film encapsulation layer may further include: a second encapsulation inorganic layer disposed between the display device layer and the first encapsulation inorganic layer; and an encapsulation organic layer disposed between the first encapsulation inorganic layer and the second encapsulation inorganic layer.

An exemplary embodiment of the inventive concept also provides a display module including: a base layer having a display area and a non-display area disposed outside the display area, and a circuit device including an intermediate inorganic layer overlapping the display area and the non-display area and an intermediate organic layer disposed on the intermediate inorganic layer to expose a portion of the intermediate inorganic layer within the non-display area. The display module further includes organic light emitting diodes disposed on the intermediate organic layer to overlap the display area, an encapsulation inorganic layer disposed on the intermediate organic layer to cover the organic light emitting diodes, and a touch sensing layer including a plurality of touch electrodes and a inorganic touch layer overlapping the display area and the non-display area and contacting the intermediate inorganic layer exposed by the intermediate organic layer, with the touch sensing layer being disposed on the encapsulation inorganic layer.

The foregoing general description and the following detailed description are exemplary and explanatory and are intended to provide further explanation of the claimed subject matter.

BRIEF DESCRIPTION OF THE FIGURES

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
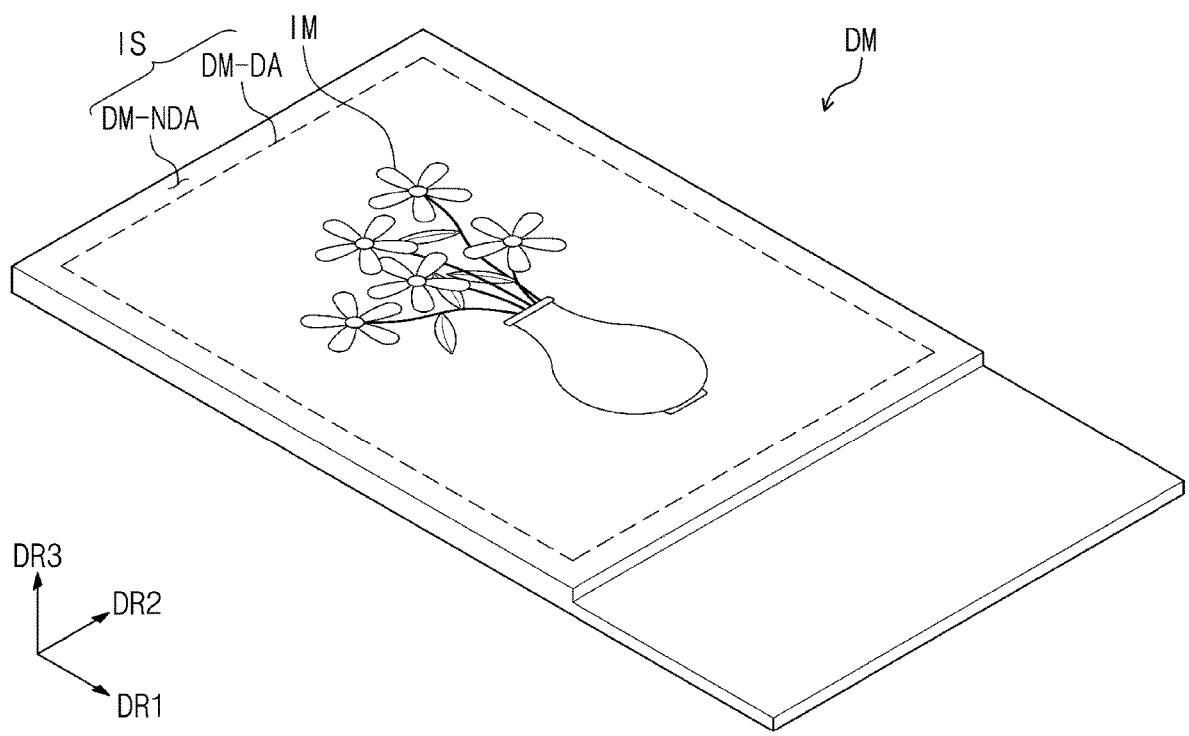
FIG. 1 is a perspective view of a display module according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
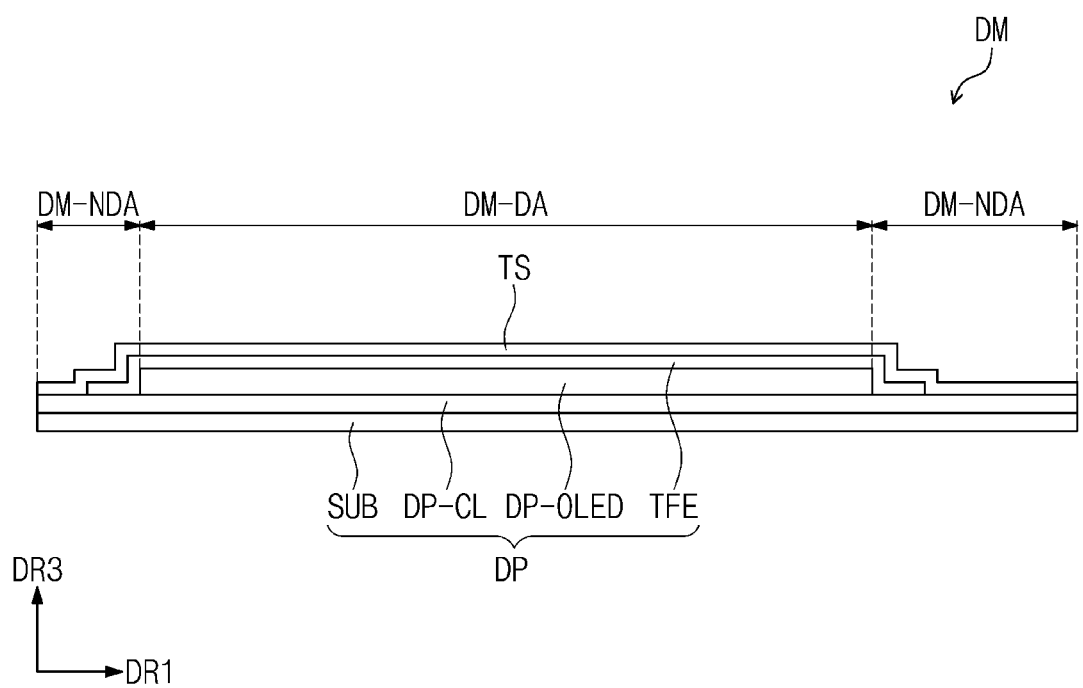
FIG. 2 is a cross-sectional view of the display module according to an exemplary embodiment.

FIG. 1 is a perspective view of a display module DM according to an exemplary embodiment of the inventive concept. FIG. 2 is a cross-sectional view of a display module DM according to an exemplary embodiment of the inventive concept.

As illustrated in FIG. 1, a display surface IS on which an image IM is displayed is parallel to a surface that is defined by a first directional axis DR1 and a second directional axis DR2. A normal direction of the display surface IS, i.e., a thickness direction of the display module DM is indicated as a third directional axis DR3. A front surface (or top surface) and a rear surface (or bottom surface) of each of members is distinguished by the third directional axis DR3. However, directions indicated as the first to third directional axes DR1, DR2, and DR3 may be a relative concept and thus changed into different directions. Hereinafter, the first to third directions may be directions indicated by the first to third directional axes DR1, DR2, and DR3 and designated by the same reference numerals, respectively.

The display module DM according to the current embodiment may be a flat rigid display module. However, embodiments of the inventive concept is not limited thereto. For example, the display module according to an exemplary embodiment of the inventive concept may be a flexible display module DM. The display module DM according to an exemplary embodiment of the inventive concept may be applied for large-sized electronic devices such as televisions and monitors and small and middle-sized electronic devices such as mobile phones, tablet PC, navigation units for vehicles, game consoles, and smart watches.

As illustrated in FIG. 1, the display module DM includes a display area DM-DA on which the image IM is displayed and a non-display area DM-NDA that is adjacent to the display area DM-DA. The non-display area DM-NDA may be an area on which an image is not displayed. FIG. 1 illustrates a flower vase as an example of the image IM. For example, the display area DM-DA may have a rectangular shape. The non-display area DM-NDA may surround the display area DM-DA. However, exemplary embodiments of the inventive concept are not limited thereto. For example, the display area DM-DA and the non-display area DM-NDA may be relatively designed in shape.

FIG. 2 is a cross-sectional view of the display module DM according to an exemplary embodiment of the inventive concept. FIG. 2 illustrates a cross-section defined by the first directional axis DR1 and the third directional axis DR3.

As illustrated in FIG. 2, the display module DM includes a display panel DP and a touch sensing unit TS (or a touch sensing layer). Although not separately shown, the display module DM according to an exemplary embodiment of the inventive concept may further include a protection member disposed on a bottom surface of the display panel DP and an antireflection member and/or a window member disposed on a top surface of the touch sensing unit TS.

The display panel DP may be an emission-type display panel. That is, exemplary embodiments of the inventive concept are not limited to a kind of display panels. For example, the display panel DP may be an organic light emitting display panel and a quantum-dot light emitting display panel. In the organic light emitting display panel, a light emitting layer includes an organic light emitting material. In the quantum-dot light emitting display panel, a light emitting layer includes a quantum dot and a quantum rod. Hereinafter, the organic light emitting display panel will be described as an example of the display panel DP.

The display panel DP includes a base layer SUB, a circuit device layer DP-CL disposed on the base layer SUB, a display device layer DP-OLED, and a thin film encapsulation layer TFE. Although not separately shown, the display panel DP may further include functional layers such as the antireflection layer, a reflective index adjusting layer, and the like.

The base layer SUB may include at least one plastic film. The base layer SUB may include a plastic substrate, a glass substrate, a metal substrate, or an organic/inorganic composite substrate as a flexible substrate. The display area DM-DA and the non-display area DM-NDA, which are described with reference to FIG. 1, may be defined in the same manner on the base layer SUB.

The circuit device layer DP-CL includes at least one intermediate insulation layer and a circuit device. The intermediate insulation layer includes at least one intermediate inorganic layer and at least one intermediate organic layer. The circuit device includes signal lines, a driving circuit of the pixel, and the like. This will be described later in detail.

The display device layer DP-OLED may include organic light emitting diodes. The display device layer DP-OLED may further include an organic layer such as a pixel defining layer.

The thin film encapsulation layer TFE seals the display device layer DP-OLED. The thin film encapsulation layer TFE includes at least one inorganic layer (hereinafter, referred to as an encapsulation inorganic layer). The thin film encapsulation layer TFE may further include at least one organic layer (hereinafter, referred to as an encapsulation organic layer). The encapsulation inorganic layer protects the display device layer DP-OLED against moisture/oxygen, and the encapsulation organic layer protects the display device layer DP-OLED against foreign substances such as dust particles. The encapsulation inorganic layer may include a silicon nitride layer, a silicon oxynitride layer, a silicon oxide layer, a titanium oxide layer, or an aluminum oxide layer. The encapsulation organic layer may include an acrylic-based organic layer, but exemplary embodiments of the inventive concept are not limited thereto.

The touch sensing unit TS acquires coordinate information of an external input. The touch sensing unit TS may be directly disposed on the organic light emitting display panel DP. In this specification, the term "directly disposed" means that a component is formed through the continuous process except that the component adheres by using a separate adhesion layer.

The touch sensing unit TS may have a multilayer structure. The touch sensing unit TS may include a conductive layer having a single-layer or multilayer structure. The touch sensing unit TS may include an insulation layer having a single-layer or multilayer structure.

For example, the touch sensing unit TS may sense an external input in a capacitive manner. The exemplary embodiment of the inventive concept is not specifically limited to the operation manner of the touch sensing unit TS. In an exemplary embodiment of the inventive concept, the touch sensing unit TS may sense an external input in an electromagnetic inductive coupling or pressure sensitive manner.

Figure 3:
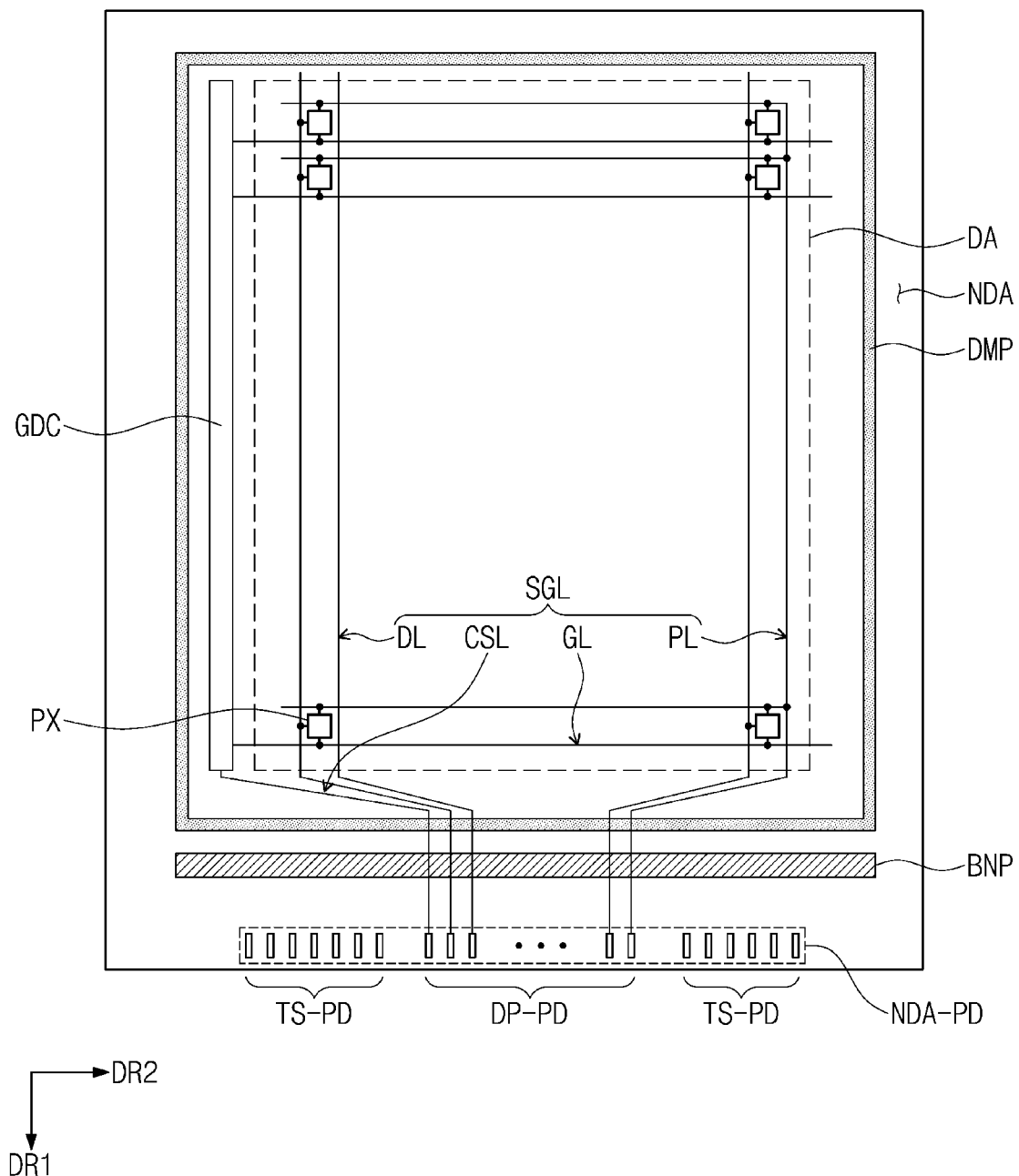
FIG. 3 is a plan view of a display panel according to an exemplary embodiment.
Figure 4:
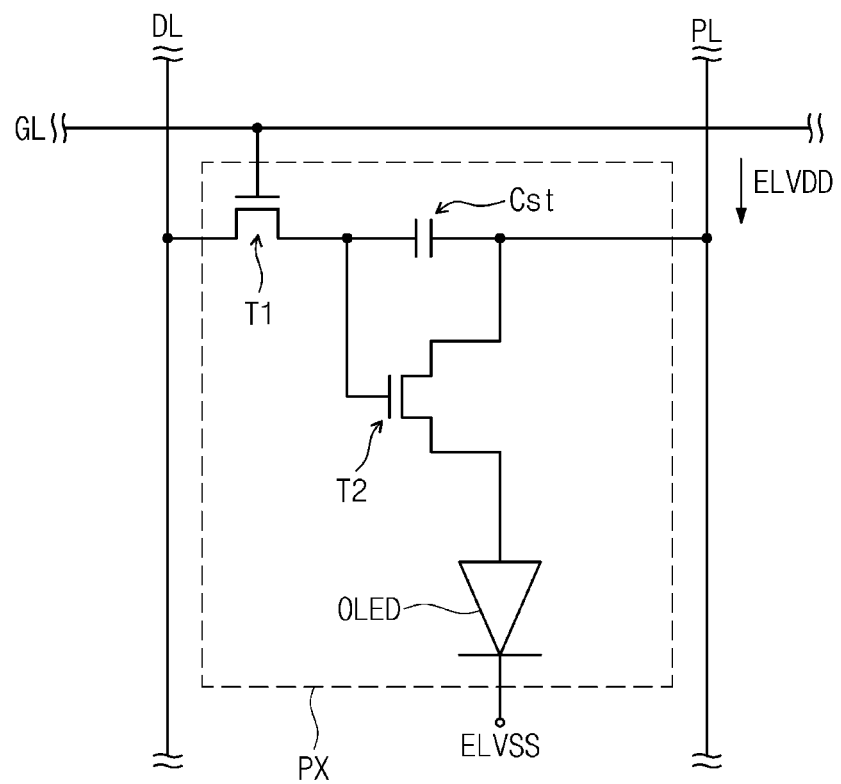
FIG. 4 is an equivalent circuit diagram of a pixel according to an exemplary embodiment.
Figure 5:
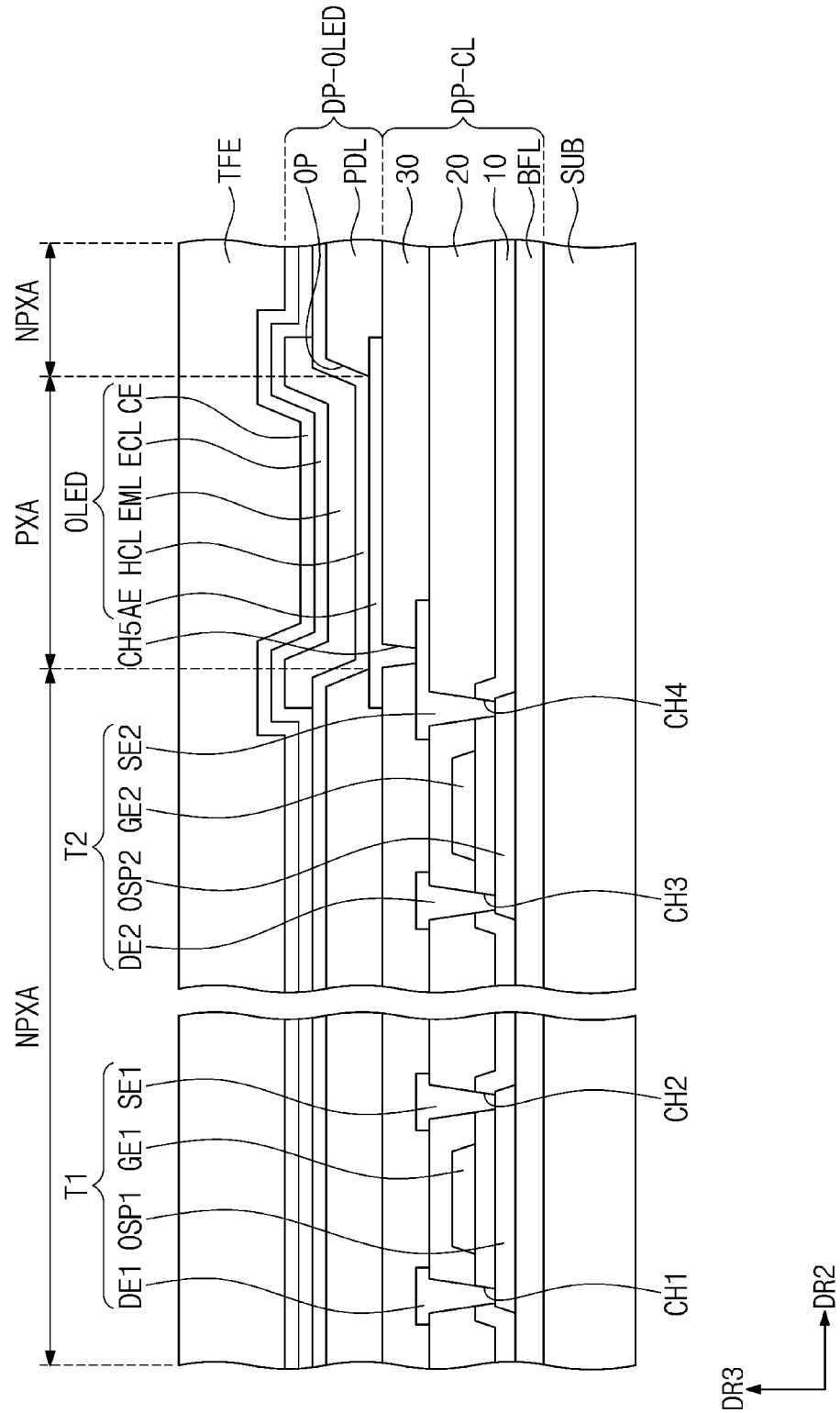
FIG. 5 is an enlarged cross-sectional view of the display panel according to an exemplary embodiment.

FIG. 3 is a plan view of the display panel DP according to an exemplary embodiment of the inventive concept. FIG. 4 is an equivalent circuit diagram of the pixel PX according to an exemplary embodiment of the inventive concept. FIG. 5 is an enlarged cross-sectional view of the display panel DP according to an exemplary embodiment of the inventive concept.

As illustrated in FIG. 3, the display panel DP includes a display area DA and a non-display area NDA on a plane. In this exemplary embodiment, the non-display area NDA may be defined along an edge of the display area DA. The display area DA and the non-display area NDA of the display panel DP may correspond to the display area DD-DA and the non-display area DD-NDA of the display module DM of FIG. 1, respectively. It is unnecessary that the display area DA and the non-display area NDA of the display panel DP respectively correspond to the display area DD-DA and the non-display area DD-NDA of the display module DM. For example, the display area DA and the non-display area NDA of the display panel DP may be changed according to a structure/design of the display panel DP.

The display panel DP may include a driving circuit GDC, a plurality of signal lines SGL, and a plurality of pixels PX. The pixels PX are disposed on the display area DA. Each of the pixels PX includes an organic light emitting diode and a pixel driving circuit connected to the organic light emitting diode. The driving circuit GDC, the plurality of signal lines SGL, and the pixel driving circuit may be provided in the circuit device layer DP-CL of FIG. 2.

The driving circuit GDC may include a scan driving circuit. The scan driving circuit GDC generates a plurality of scan signals, and the scan signals are successively outputted to a plurality of scan lines GL. The scan driving circuit GDC may further output other control signals to the driving circuit of each of the pixels PX.

The scan driving circuit GDC may include a plurality of thin film transistors that are manufactured through the same process as the driving circuit of the pixel PX, e.g., a low temperature polycrystalline silicon (LTPS) process or a low temperature polycrystalline oxide (LTPO) process.

The plurality of signal lines SGL includes scan lines GL, data lines DL, a power line PL, and a control signal line CSL. The scan lines GL are respectively connected to corresponding pixels PX of the plurality of pixels PX, and the data lines DL are respectively connected to corresponding pixels PX of the plurality of pixels PX. The power line PL is connected to the plurality of pixels PX. The control signal line CSL may provide control signals to the scan driving circuit GDC.

The display panel DP includes signal pads DP-PD connected to ends of the signal lines SGL. The signal pads DP-PD may be a kind of circuit device. An area of the non-display area NDA, on which the signal pads DP-PD are disposed, is defined as a pad area NDA-PD. Touch pads TS-PD connected to touch signal lines that will be described later may also be disposed on the pad area NDA-PD.

The display panel DP may include a first protrusion part DMP. The first protrusion part DMP may extend along an edge of the display area DA. The first protrusion part DMP may surround the display area DA. A portion of the first protrusion part DMP may be parallel to the pad area NDA-PD.

The display panel DP may include a second protrusion part BNP. The second protrusion part BNP may be disposed between the display area DA and the pad area NDA-PD. The second protrusion part BNP may be parallel to a portion of the first protrusion part DMP and the pad area NDA-PD. In an exemplary embodiment of the inventive concept, at least one of the first protrusion part DMP or the second protrusion part BNP may be omitted.

FIG. 4 illustrates an example of a pixel PX connected to one scan line GL, one data line DL, and the power line PL. However, exemplary embodiments of the inventive concept are not limited to the above described configuration of the pixel PX. For example, the pixel PX may be variously deformed in configuration.

The organic light emitting diode OLED may be a top emission-type diode or a bottom emission-type diode. The pixel PX includes a first transistor T1 (or a switching transistor), a second transistor T2 (or a driving transistor), and a capacitor Cst as the pixel driving circuit driving the organic light emitting diode OLED. A first power voltage ELVDD is provided to the second transistor T2, and a second power voltage ELVSS is provided to the organic light emitting diode OLED. The second power voltage ELVSS may be less than the first power voltage ELVDD.

The first transistor T1 outputs a data signal applied to the data line DL in response to a scanning signal applied to the scan line GL. The capacitor Cst charges a voltage to correspond to the data signal received from the first transistor T1.

The second transistor T2 is connected to the organic light emitting diode OLED. The second transistor T2 controls driving current flowing through the organic light emitting diode OLED to correspond to a charge amount stored in the capacitor Cst. The organic light emitting diode OLED emits light during a turn-on period of the second transistor T2.

FIG. 5 illustrates a partial cross-sectional view of the display panel DP corresponding to the equivalent circuit of FIG. 4. The circuit device layer DP-CL, the display device layer DP-OLED, and the thin film encapsulation layer TFE are successively disposed on the base layer SUB.

The circuit device layer DP-CL includes at least one inorganic layer, at least one organic layer, and a circuit device. The circuit device layer DP-CL may include a buffer layer BFL, a first intermediate inorganic layer 10, and a second intermediate inorganic layer 20, which are inorganic layers, and an intermediate organic layer 30 that is an organic layer.

The inorganic layers may include silicon nitride, silicon oxynitride, silicon oxide, and the like. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin. The circuit device includes conductive patterns and/or semiconductor patterns.

The buffer layer BFL improves a coupling force between conductive patterns or semiconductor patterns. Although not separately shown, a barrier layer for preventing foreign substances from being introduced may be further disposed on a top surface of the base layer SUB. The buffer layer BFL and the barrier layer may be selectively disposed/omitted.

A semiconductor pattern OSP1 (hereinafter, referred to as a first semiconductor pattern) of the first transistor T1 and a semiconductor pattern OSP2 (hereinafter, referred to as a second semiconductor pattern) of the second transistor T2 are disposed on the buffer layer BFL. Each of the first and second semiconductor patterns OSP1 and OSP2 may be selected from amorphous silicon, polysilicon, and a metal oxide semiconductor.

The first intermediate inorganic layer 10 is disposed on the first semiconductor pattern OSP1 and the second semiconductor pattern OSP2. A control electrode GE1 (hereinafter, referred to as a first control electrode) of the first transistor T1 and a control electrode GE2 (hereinafter, referred to as a second control electrode) of the second transistor T2 are disposed on the first intermediate inorganic layer 10. The first and second control electrodes GE1 and GE2 may be manufactured by the same photolithography process as the scan lines GL (see FIG. 5A).

The second intermediate inorganic layer 20 covering the first and second control electrodes GE1 and GE2 is disposed on the first intermediate inorganic layer 10. An input electrode DE1 (hereinafter, referred to as a first input electrode) and an output electrode SE1 (hereinafter, referred to as a first output electrode) of the first transistor T1 and an input electrode DE2 (hereinafter, referred to as a second input electrode), and an output electrode SE2 (hereinafter, referred to as a second output electrode) of the second transistor T2 are disposed on the second intermediate inorganic layer 20.

The first input electrode DE1 and the first output electrode SE1 are connected to the first semiconductor pattern OSP1 through first and second through-holes CH1 and CH2, which pass through the first and second intermediate inorganic layers 10 and 20, respectively. The second input electrode DE2 and the second output electrode SE2 are connected to the second semiconductor pattern OSP2 through third and fourth through-holes CH3 and CH4, which pass through the first and second intermediate inorganic layers 10 and 20, respectively. According to another exemplary embodiment of the inventive concept, portions of the first and second transistors T1 and T2 may be deformed into a bottom gate structure.

The intermediate organic layer 30 covering the first input electrode DE1, the second input electrode DE2, the first output electrode SE1, and the second output electrode SE2 disposed on the second intermediate inorganic layer 20. The intermediate organic layer may provide a planation surface.

The display device layer DP-OLED is disposed on the intermediate organic layer 30. The display device layer DP-OLED may include a pixel defining layer PDL and an organic light emitting diode OLED. The pixel defining layer PDL may include an organic material, like the intermediate organic layer 30. A first electrode AE is disposed on the intermediate organic layer 30. The first electrode AE is connected to the second output electrode SE2 through the fifth through-hole CH5 passing through the intermediate organic layer 30. An opening OP is defined in the pixel defining layer PDL. The opening OP of the pixel defining layer PDL exposes at least a portion of the first electrode AE.

The pixel PX may be disposed on a pixel area on a plane. The pixel area may include an emission area PXA and a non-emission area NPXA that is adjacent to the emission area PXA. The non-emission area NPXA may surround the emission area PXA. In this exemplary embodiment, the emission area PXA may be defined to correspond to a portion of the first electrode AE exposed by the opening OP.

A hole control layer HCL may be commonly disposed on the emission area PXA and the non-emission area NPXA. Although not separately shown, a common layer such as the hole control layer HCL may be commonly disposed on the plurality of pixels PX (see FIG. 3).

The emission layer EML is disposed on the hole control layer HCL. The emission layer EML may be disposed on an area corresponding to the opening OP. That is, the emission layer EML may be formed to be separated from each other in the plurality of pixels PX. Also, the emission layer EML may include an organic material and/or an inorganic material. Although the patterned emission layer EML is illustrated as an example in this exemplary embodiment, the emission layer EML may be commonly disposed on the plurality of pixels PX. Here, the emission layer EML may emit white light. Also, the emission layer EML may have a multilayer structure.

An electronic control layer ECL is disposed on the emission layer EML. Although not separately shown, the electronic control layer ECL may be commonly disposed on the plurality of pixels PX (see FIG. 3).

A second electrode CE is disposed on the electronic control layer ECL. The second electrode CE is commonly disposed on the plurality of pixels PX.

The thin film encapsulation layer TFE is disposed on the second electrode CE. The thin film encapsulation layer TFE is commonly disposed on the plurality of pixels PX. In this exemplary embodiment, the thin film encapsulation layer TFE directly covers the second electrode CE. In an exemplary embodiment of the inventive concept, a capping layer covering the second electrode CE may be further disposed between the thin film encapsulation layer TFE and the second electrode CE. Here, the thin film encapsulation layer TFE may directly cover the capping layer.

Figure 6A:
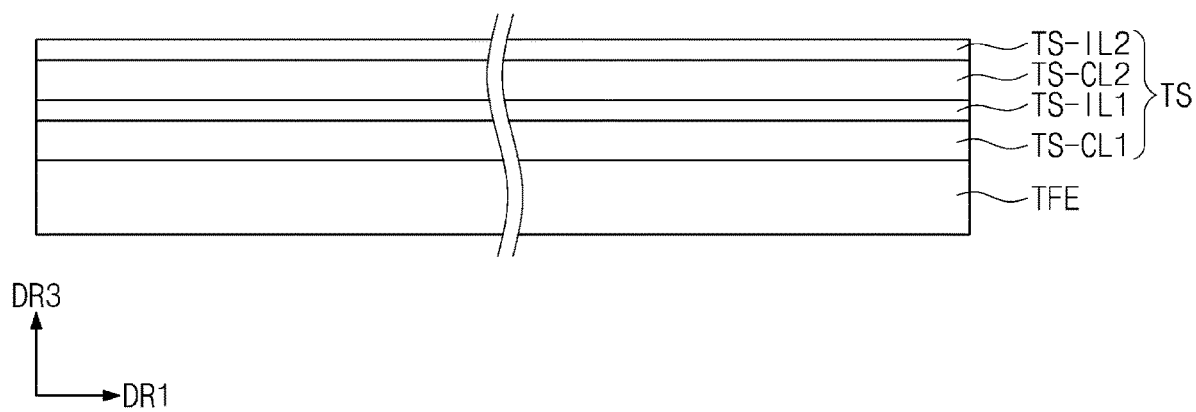
FIG. 6A is a cross-sectional view of a touch sensing unit according to an exemplary embodiment.
Figure 6B:
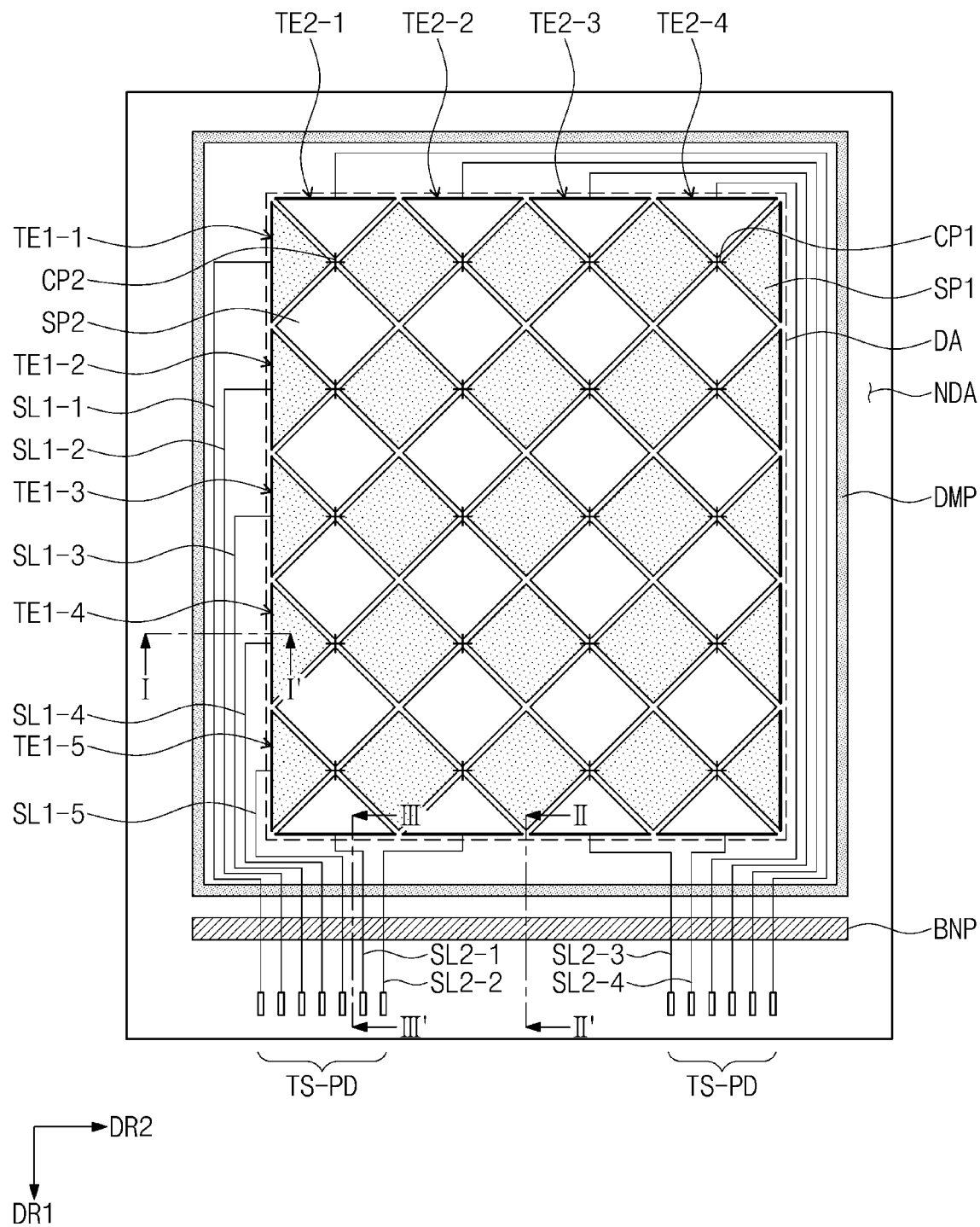
FIG. 6B is a plan view of the touch sensing unit according to an exemplary embodiment.
Figure 7A:
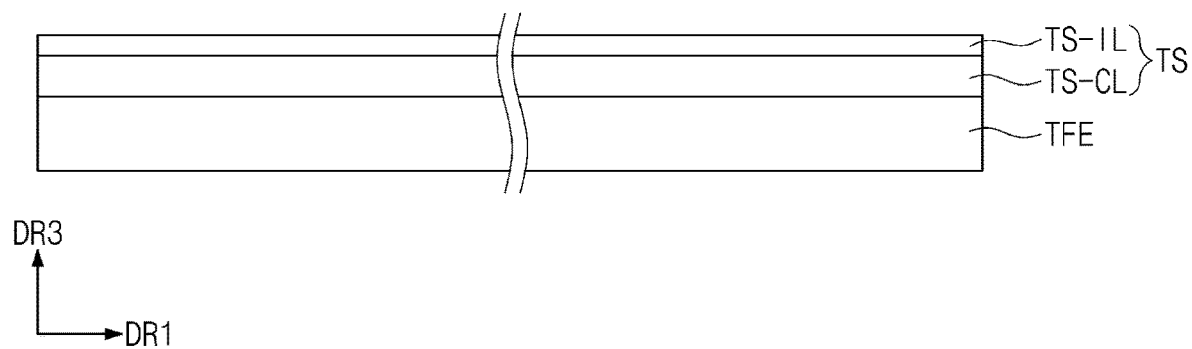
FIG. 7A is a cross-sectional view of a touch sensing unit according to an exemplary embodiment.
Figure 7B:
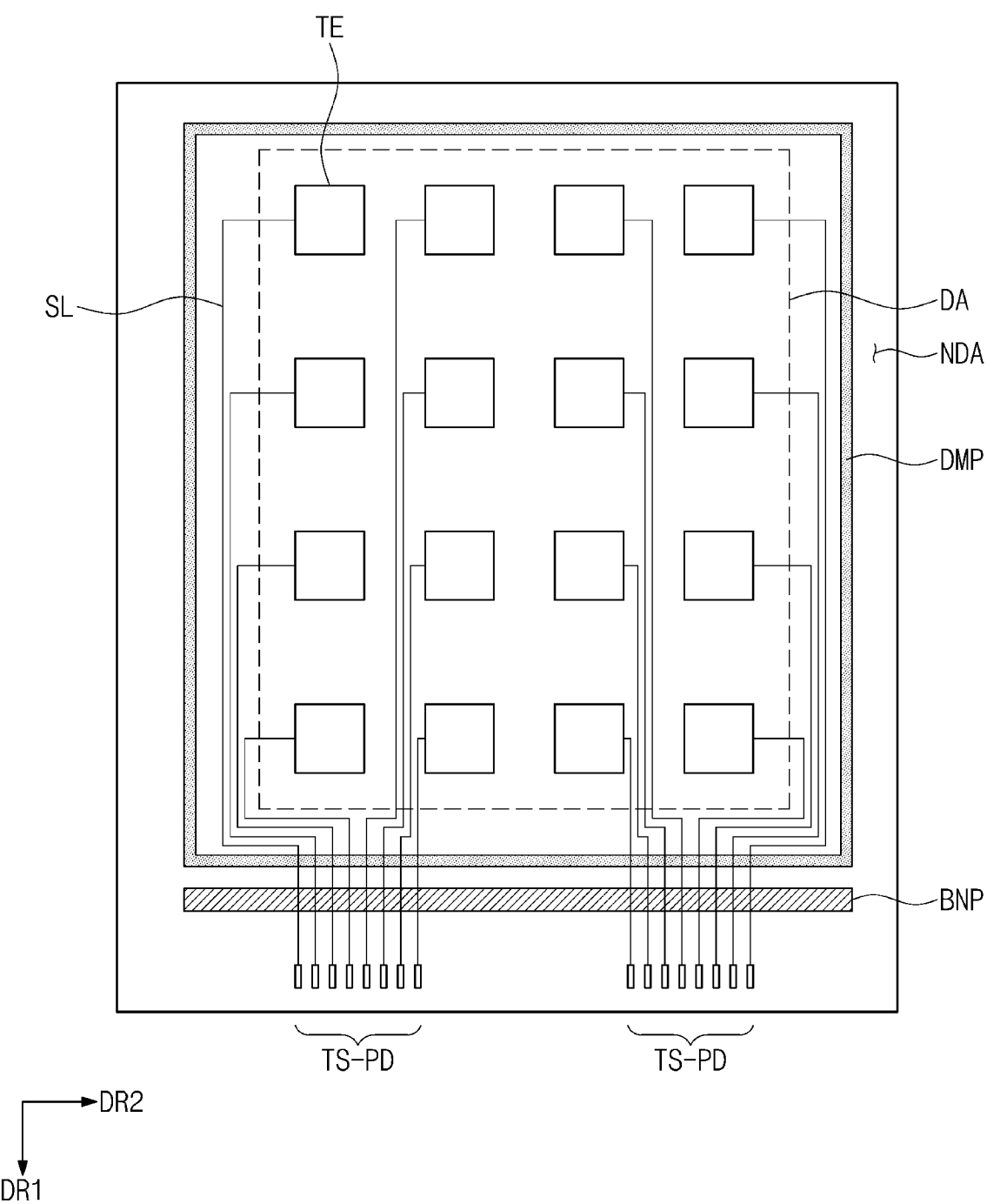
FIG. 7B is a plan view of the touch sensing unit according to an exemplary embodiment.

FIG. 6A is a cross-sectional view of the touch sensing unit TS according to an exemplary embodiment of the inventive concept. FIG. 6B is a plan view of the touch sensing unit according to an exemplary embodiment of the inventive concept. FIG. 7A is a cross-sectional view of the touch sensing unit TS according to an exemplary embodiment of the inventive concept. FIG. 7B is a plan view of the touch sensing unit according to an exemplary embodiment of the inventive concept.

As illustrated in FIG. 6A, the touch sensing layer TS include a first conductive layer TS-CL1, a first insulation layer TS-IL1 (hereinafter, referred to as a first touch insulation layer or touch inorganic layer), a second conductive layer TS-CL2, and a second insulation layer TS-IL2 (hereinafter, referred to as a second touch insulation layer or touch organic layer). The first conductive layer TS-CL1 may be directly disposed on the thin film encapsulation layer TFE. Exemplary embodiments of the inventive concept are not limited thereto. For example, another inorganic layer or organic layer may be further disposed between the first conductive layer TS-CL1 and the thin film encapsulation layer TFE.

Each of the first conductive layer TS-CL1 and the second conductive layer TS-CL2 may have a single-layer structure or a multilayer structure in which a plurality of layers are laminated in the third directional axis DR3. The conductive layer having the multilayer structure may include a transparent conductive layer and at least two metal layers. The conductive layer having the multilayer structure may include metal layers including metals different from each other. The transparent conductive layer may include indium tin oxide (ITO), indium zinc oxide (IZO), zinc oxide (ZnO), or indium tin zinc oxide (ITZO), PEDOT, a metal nano wire, and graphene. The metal layer may include molybdenum, silver, titanium, copper, aluminum, and an alloy thereof. For example, each of the first and second conductive layers TS-CL1 and TS-CL2 may have a three-layer structure of titanium/aluminum/titanium.

Each of the first and second conductive layers TS-CL1 and TS-CL2 may include a plurality of patterns. Hereinafter, an example in which the first conductive layer TS-Cl1 includes first conductive patterns, and the second conducive layer TS-CL2 includes second conductive patterns will be described. Each of the first and second conductive patterns may include touch electrodes and touch signal lines.

Each of the first and second touch insulation layers TS-IL1 and TS-IL2 may include inorganic or organic material. At least one of the first and second touch insulation layers TS-IL1 and TS-IL2 may include an inorganic layer. The inorganic layer may include at least one of aluminum oxide, titanium oxide, silicon oxide, silicon oxynitride, zirconium oxide, or hafnium oxide.

At least one of the first and second touch insulation layers TS-IL1 and TS-IL2 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin. In this exemplary embodiment, the first touch insulation layer TS-IL1 is described as a inorganic touch layer, and the second touch insulation layer TS-IL2 is described as a touch organic layer. As illustrated in FIG. 6B, the touch sensing unit TS may include first touch electrodes TE1-1 to TE1-5, first touch signal lines SL1-1 to SL1-5 connected to the first touch electrodes TE1-1 to TE1-1, second touch electrodes TE2-1 to TE2-4, second touch signal lines SL2-1 to SL2-4 connected to the second touch electrodes TE2-1 to TE2-4, and touch pads TS-PD connecting the first touch signal lines SL1-1 to SL1-5 to the second touch signal lines SL2-1 to SL2-4. The first touch signal lines SL1-1 to SL1-5 are connected to ends of the first touch electrodes TE1-1 to TE1-5, respectively. The second touch signal lines SL2-1 to SL2-4 are connected to both ends of the second touch electrodes TE2-1 to TE2-4, respectively. In an exemplary embodiment of the inventive concept, the first touch signal lines SL1-1 to SL1-5 may also be connected to both ends of the first touch electrodes TE1-1 to TE1-5, or the second touch signal lines SL2-1 to SL2-4 may be respectively connected to ends of the second touch electrodes TE2-1 to TE2-4. The first protrusion part DMP and the second protrusion part BNP provided in the display panel DP are additionally illustrated in FIG. 6B so as to represent a relative position with respect to the touch sensing unit TS.

Each of the first touch electrodes TE1-1 to TE1-5 may have a mesh shape in which a plurality of touch openings are defined. Each of the first touch electrodes TE1-1 to TE1-5 includes a plurality of first touch sensing parts SP1 and a plurality of first connection parts CP1. The first touch sensing parts SP1 are arranged in the second direction DR2. Each of the first connection parts CP1 connects two first touch sensing parts SP1, which are adjacent to each other, of the first touch sensing parts SP1. Although not separately shown, the first touch signal lines SL1-1 to SL1-5 may also have a mesh shape.

The second touch electrode TE2-1 and TE2-4 are insulated from the first touch electrodes TE1-1 to TE1-5 and cross the first touch electrodes TE1-1 to TE1-5. Each of the second touch electrodes TE2-1 to TE2-4 may have a mesh shape in which a plurality of touch openings are defined. Each of the second touch electrodes TE2-1 to TE2-4 includes a plurality of second touch sensing parts SP2 and a plurality of second connection parts CP2. The second touch sensing parts SP2 are arranged in the first direction DR1. Each of the second connection parts CP2 connects two second touch sensing parts SP2, which are adjacent to each other, of the second touch sensing parts SP2. The second touch signal lines SL2-1 or SL2-4 may also have a mesh shape.

The first touch electrode TE1-1 to TE1-5 and the second touch electrode TE2-1 to TE2-4 are capacitively coupled to each other. Since touch detection signals are applied to the first touch electrodes TE1-1 to TE1-5, capacitors are disposed between the first touch sensing parts SP1 and the second touch sensing parts SP2.

Portions of the plurality of first touch sensing parts SP1, the plurality of first connection parts CP1, and the first touch signal lines SL1-1 to SL1-5 and portions of the plurality of second touch sensing parts SP2, the plurality of second connection parts CP2, and the second touch signal lines SL2-1 to SL2-4 may be formed by patterning the first conductive layer TS-CL1 of FIG. 6A, and the other portions may be formed by patterning the second conductive layer TS-CL2 of FIG. 6A. In this exemplary embodiment, the plurality of first connection parts CP1 may be formed from the first conductive layer TS-CL1, and the plurality of first touch sensing parts SP1, the first touch signal lines SL1-1 to SL1-5, the plurality of second touch sensing parts SP2, the plurality of second connection parts CP2, and the second touch signal lines SL2-1 to SL2-4 may be formed from the second conductive layer TS-CL2.

Although the touch sensing unit TS in which the plurality of first connection parts CP1 and the plurality of second connection parts CP2 cross each other is illustrated as an example, exemplary embodiments of the inventive concept are not limited thereto. For example, each of the second connection parts CP2 may be deformed into a V shape so that the second connection parts CP2 do not overlap the plurality of first connection parts CP1. The V-shaped second connection parts CP2 may overlap the first touch sensing parts SP1. Although the first and second touch sensing parts SP1 and SP2, each of which has a diamond or triangular shape, are illustrated in this exemplary embodiment, exemplary embodiments of the inventive concept are not limited thereto.

As illustrated in FIG. 7A, the touch sensing unit TS according to an exemplary embodiment of the inventive concept may be a single-layer touch sensing unit including the conductive layer TS-CL and the insulation layer TS-IL (touch insulation layer). The single-layer touch sensing unit may acquire coordinate information in a self capacitive manner.

The conductive layer TS-CL may have a single-layer structure or a multilayer structure in which a plurality of layers are laminated in the third directional axis DR3. The conductive layer having the multilayer structure may include at least two of the transparent conductive layers and the metal layers. The conductive layer TS-CL includes a plurality of patterns such as the touch electrode and the touch signal lines. The touch insulation layer TS-IL includes at least inorganic layer. The touch insulation layer TS-IL may further include an organic layer.

The touch sensing unit TS include touch electrodes TE disposed spaced apart from each other and touch signal lines SL. The touch electrodes TE may be arranged in the form of a matrix, and the touch signal lines SL may be respectively connected to the touch electrodes TE. Exemplary embodiments of the inventive concept are not particularly limited to the shape and arrangement of the touch electrodes TE. A portion of the touch signal lines SL may be disposed on the display area DA, and a portion of the touch signal lines SL may be disposed on the non-display area NDA.

Figure 8A:
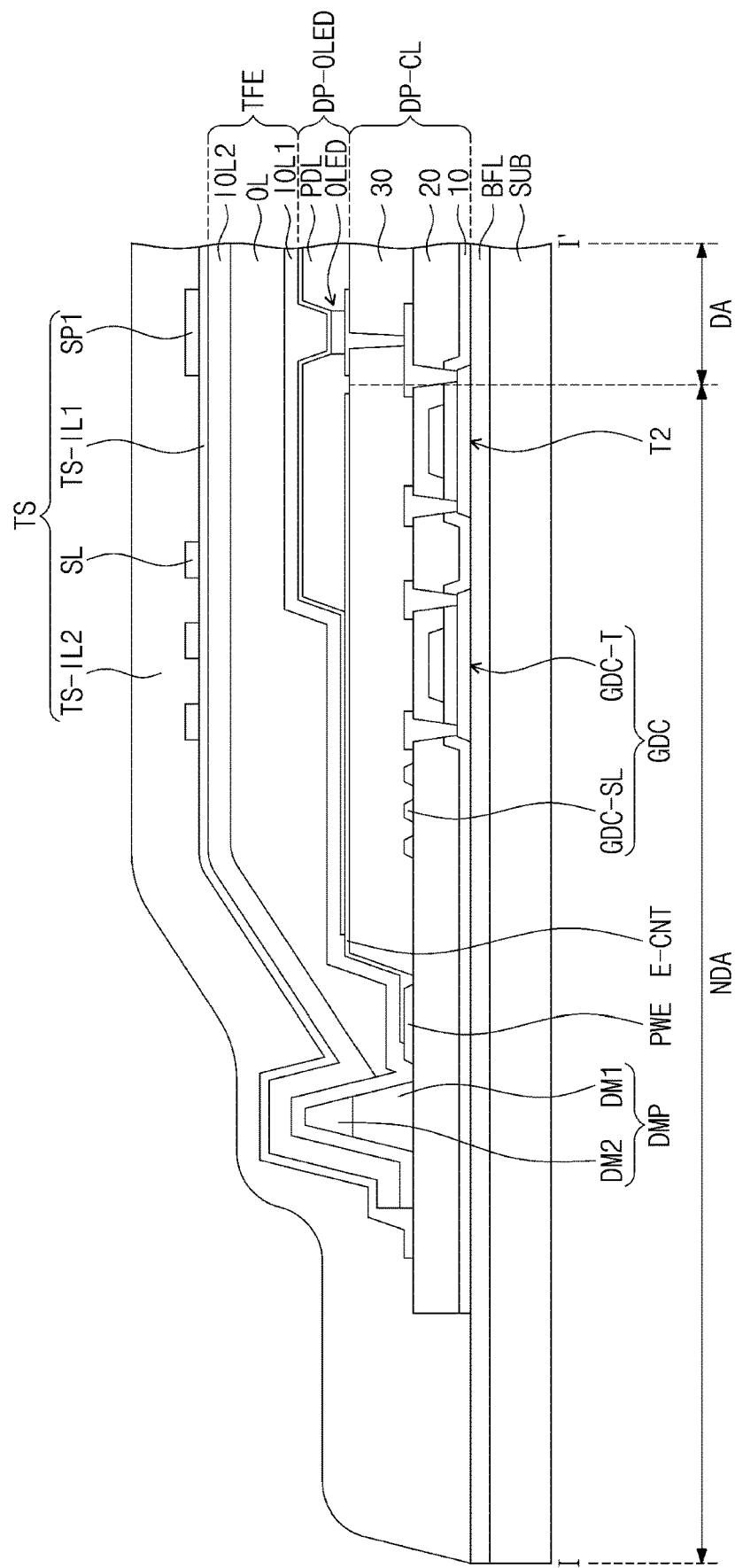
FIG. 8A, FIG. 8B, and FIG. 8C are enlarged cross-sectional views of the display module according to an exemplary embodiment.
Figure 8B:
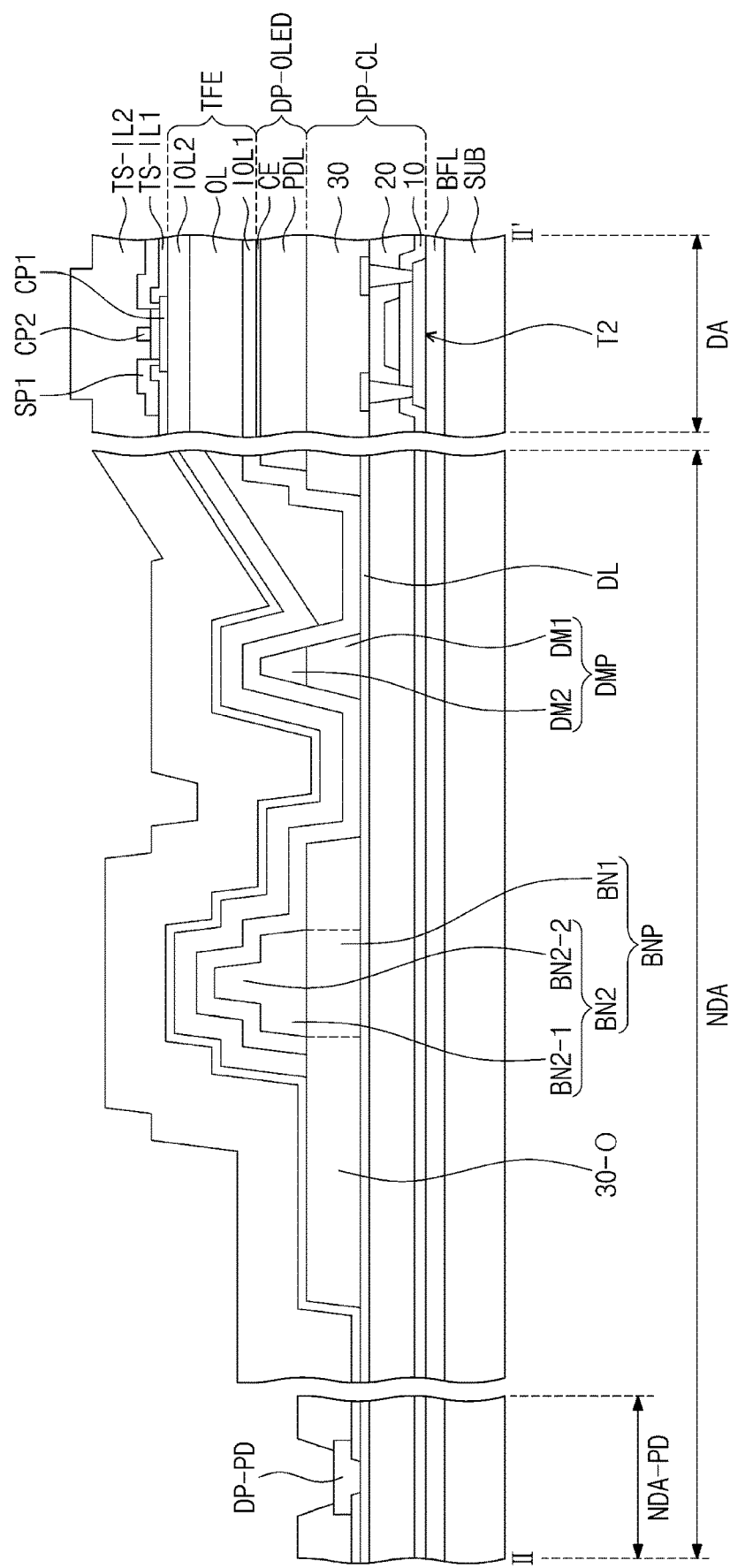
Figure 8C:
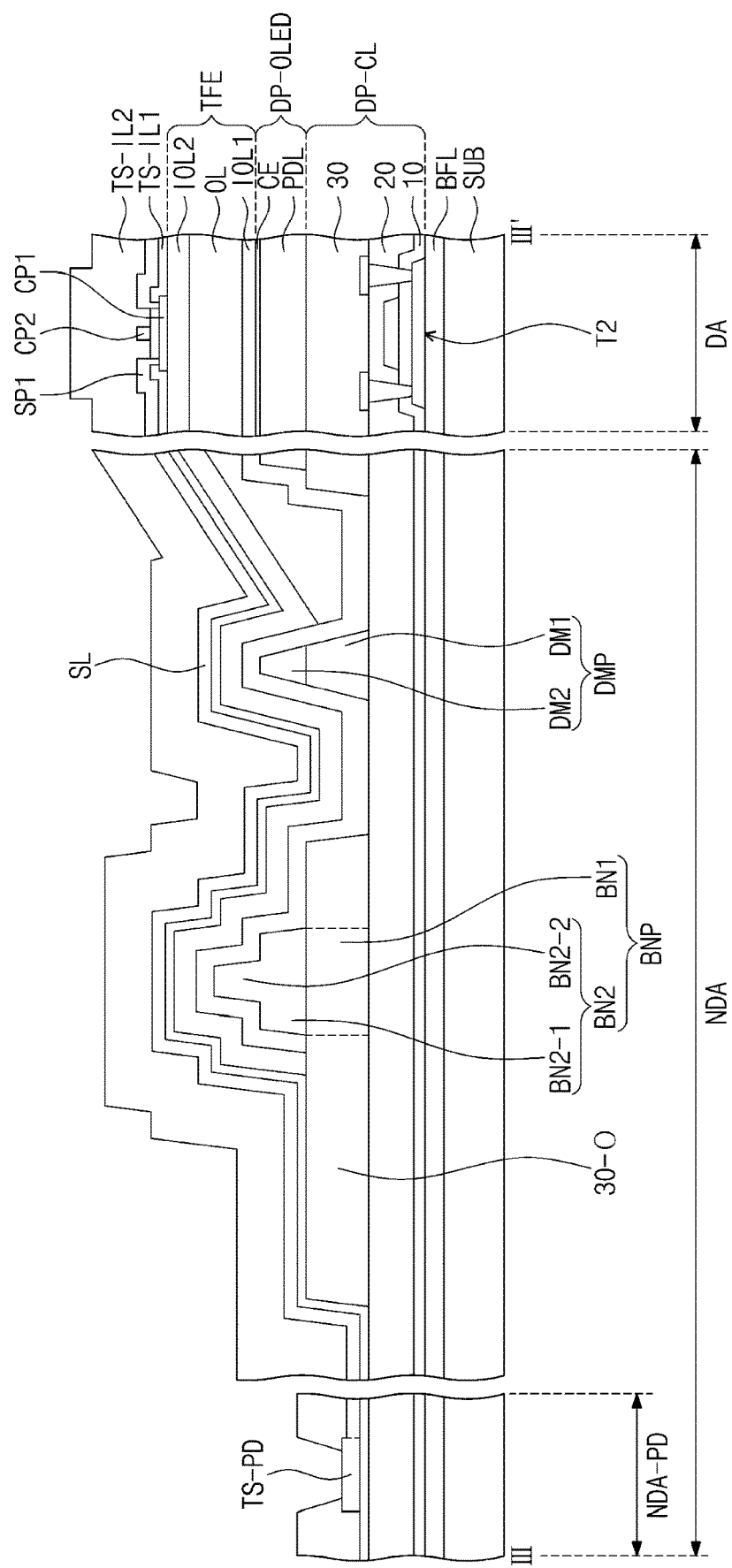

FIGS. 8A and 8B are enlarged cross-sectional views of the display module DM according to an exemplary embodiment of the inventive concept. FIG. 8A is a cross-sectional view taken along line I-I' of FIG. 6B, and FIG. 8B is a cross-sectional view taken along line II-II' of FIG. 6B. FIG. 8C is a cross-sectional view taken along line of FIG. 6B. FIG. 8B illustrates a cross-section that overlaps the data line DL, and FIG. 8C illustrates a cross-section that overlaps the touch signal line SL.

The circuit device layer DP-CL, the display device layer DP-OLED, and the thin film encapsulation layer TFE, which are disposed on the display area DA, have the same laminated structure as the constitutions described with reference to FIG. 5, and thus, their detailed descriptions will be omitted. However, the hole control layer HCL and the electron control layer ECL are not illustrated in FIGS. 8A and 8B. The touch sensing unit TS has the same laminated structure as that described with reference to FIGS. 6A and 6B, and thus, its detailed described will be omitted. The thin film encapsulation layer TFE including a first encapsulation inorganic layer IOL1, a second encapsulation inorganic layer IOL2, and an encapsulation organic layer OL disposed between the first encapsulation inorganic layer IOL1 and the second encapsulation inorganic layer IOL2 will be described as an example.

As illustrated in FIGS. 8A and 8B, a scan driving circuit GDC constituting the circuit device layer DP-CL is disposed on the non-display area NDA. The scan driving circuit GDC includes at least one transistor GDC-T manufactured through the same process as the pixel transistor T2. The scan driving circuit GDC may include signal lines GSC-SL disposed on the same layer as the input electrode of the pixel transistor T2. Although are not separately shown, the scan driving circuit GDC may further include signal lines disposed on the same layer as the control electrode of the pixel transistor T2.

A power electrode PWE providing the second power voltage ELVSS is disposed outside the scan driving circuit GDC. The power electrode PWE may receive a second power voltage from the outside. A connection electrode E-CNT is disposed on the intermediate organic layer 30. The connection electrode E-CNT connects the power electrode PWE to the second electrode CE. Since the connection electrode E-CNT is manufactured through the same process as the first electrode AE, the connection electrode E-CNT may include the same layer structure and the same material as the first electrode AE. The connection electrode E-CNT may have the same thickness as the first electrode AE.

One data line DL disposed on the second intermediate inorganic layer 20 is illustrated as an example. The signal pad DP-PD is connected to an end of the data line DL.

As illustrated in FIGS. 8A to 8C, the first protrusion part DMP may have a multilayer structure. A lower portion DM1 may be formed at the same time as the intermediate organic layer 30, and an upper portion DM2 may be formed at the same time as the pixel defining layer PDL. The first protrusion part DMP may prevent a liquid organic material from being spread to the outside of each of the intermediate inorganic layers 10 and 20 while the encapsulation organic layer OL is formed. The liquid organic material of the encapsulation organic layer OL may be formed on the first encapsulation inorganic layer IOL1 in an inkjet manner. Here, the first protrusion part DMP may set a boundary of an area on which the liquid organic material is disposed.

The second protrusion part BNP may have a multilayer structure. A lower portion BN1 may be formed at the same time as the intermediate organic layer 30, and an upper portion BN2 may be formed at the same time as the pixel defining layer PDL. The upper portion BN2 has a stepped portion and includes a first portion BN2-1 and a second portion BN2-2, which are integrated with each other. The second protrusion part BNP has a height greater than that of the first protrusion part DMP by a height of the second portion BN2-2. The second protrusion part BNP supports a mask that is used while the encapsulation inorganic layers IOL1 and IOL2 are formed.

The circuit device layer DP-CL may further include an outer organic layer 30-O connected to the second protrusion part BNP. The outer organic layer 30-O may have a multilayer structure. The outer organic layer 30-O may include a lower portion that is formed at the same time as the intermediate organic layer 30 and an upper portion that is formed at the same time as the pixel defining layer PDL. The outer organic layer 30-O is spaced apart from the intermediate organic layer 30 and disposed between the display area DA and the pad area NDA-PD.

The first encapsulation inorganic layer IOL1 and the second encapsulation inorganic layer IOL2 overlap the first protrusion part DMP. The first encapsulation inorganic layer IOL1 and the second encapsulation inorganic layer IOL2 may also overlap the second protrusion part BNP. The intermediate organic layer 30 and the first protrusion part DMP are spaced apart from each other, and the first protrusion part DMP and the second protrusion part BNP are spaced apart from each other. Thus, an organic material is not disposed between the intermediate organic layer 30 and the first protrusion part DMP and between the first protrusion part DMP and the second protrusion part BNP. The first encapsulation inorganic layer IOL1 may contact the second intermediate inorganic layer 20 on the above-described spaced areas. Although a portion of the data line DL is disposed between the second intermediate inorganic layer 20 and the first encapsulation inorganic layer IOL1 in FIG. 8B, the first encapsulation inorganic layer IOL1 and the second intermediate inorganic layer 20 may contact each other on the other area on which the data line DL is not disposed, as illustrated in FIG. 8C.

The inorganic touch layer TS-IL1 overlaps the first protrusion part DMP and the second protrusion part BNP. The inorganic touch layer TS-IL1 contacts the second intermediate inorganic layer 20, which is exposed from the intermediate organic layer 30, the first protrusion part DMP, the second protrusion part BNP, and the outer organic layer 30-O. Although the data line DL is disposed between the inorganic touch layer TS-IL1 and the second intermediate inorganic layer 20 in FIG. 8B, the inorganic touch layer TS-IL1 and the second intermediate inorganic layer 20 may contact each other on the other area on which the data line DL is not disposed, as illustrated in FIG. 8C.

Figure 9A:
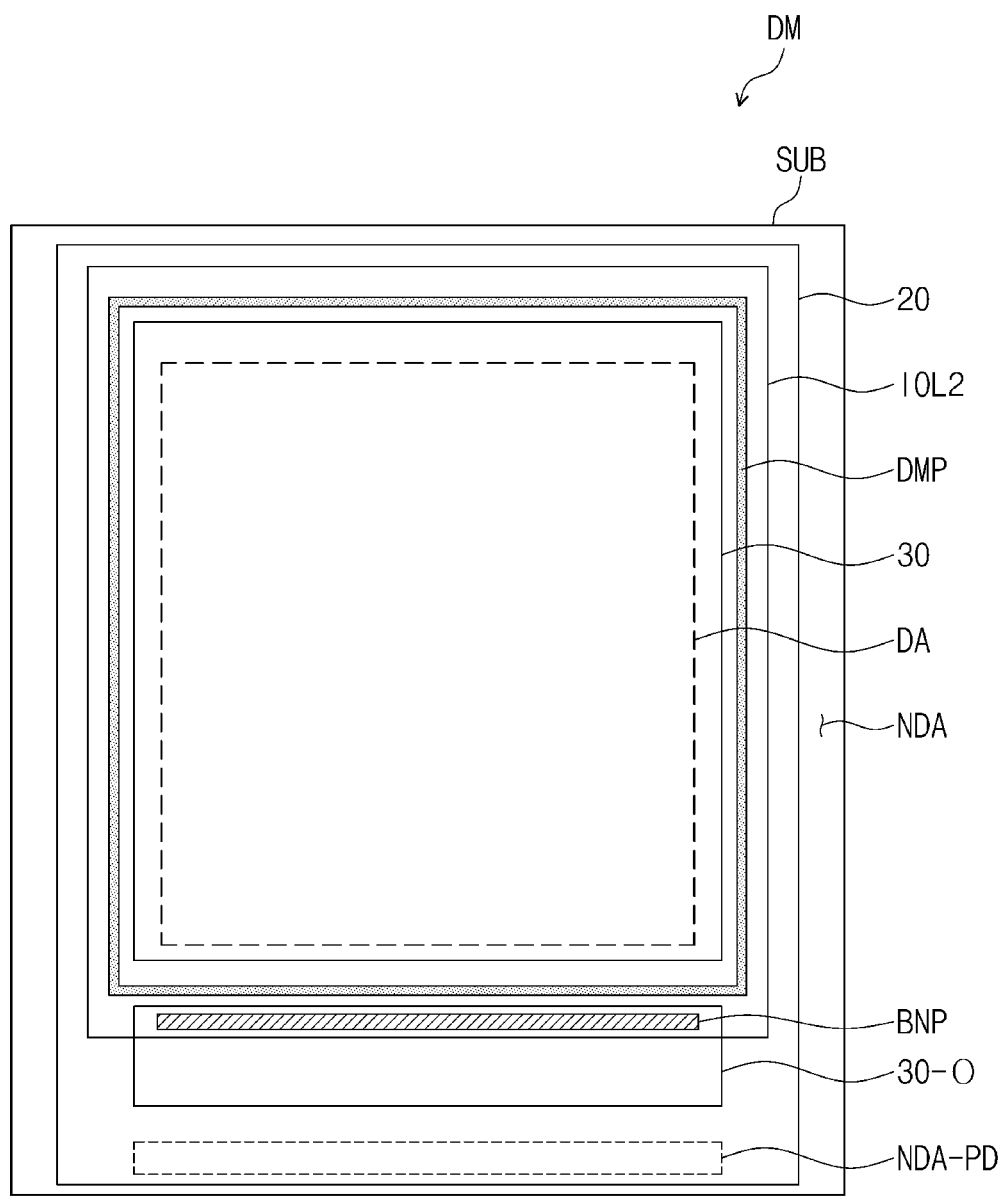
FIG. 9A and FIG. 9B are plan views illustrating a process of manufacturing the display module according to an exemplary embodiment.
Figure 9B:
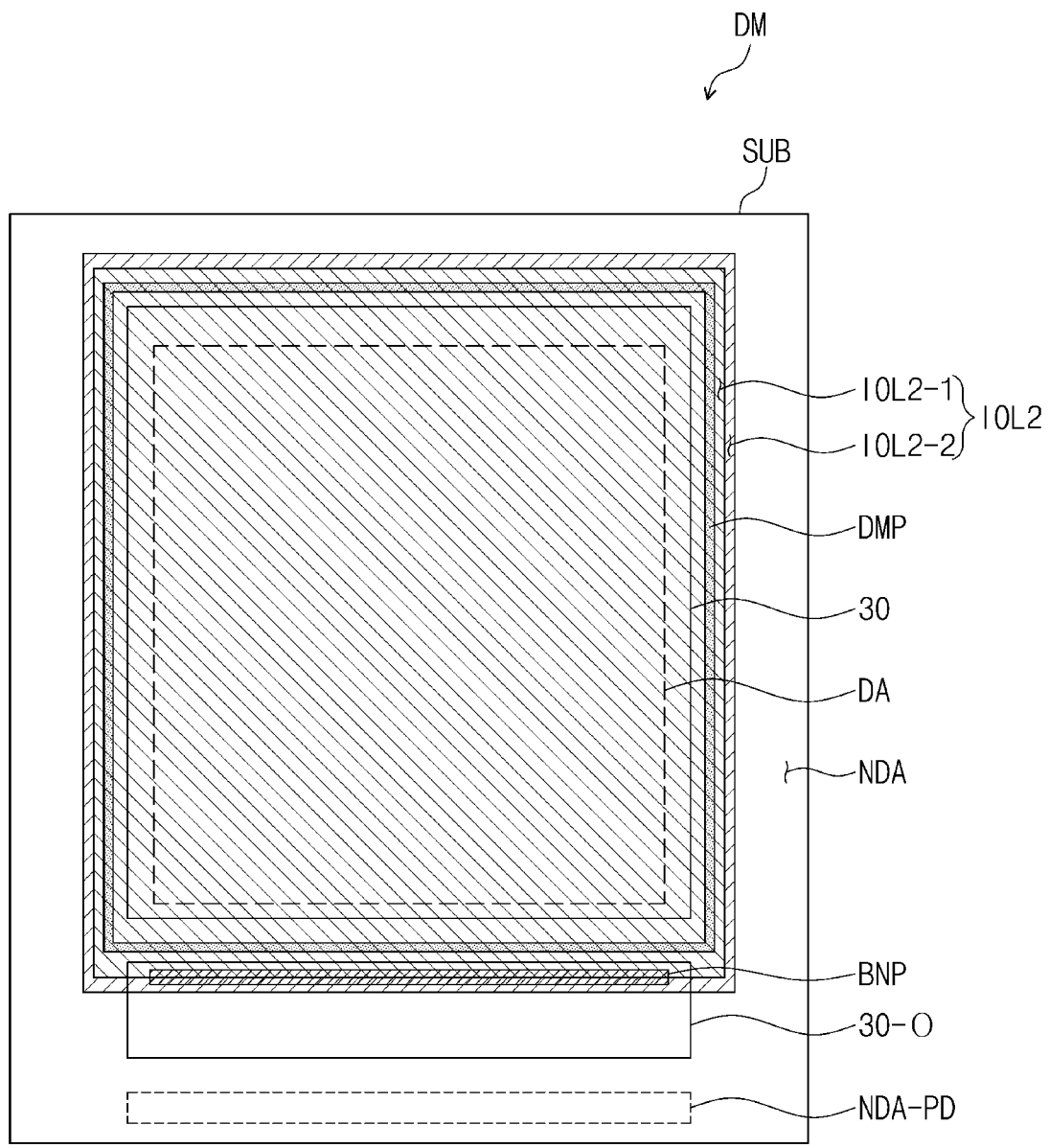
Figure 10A:
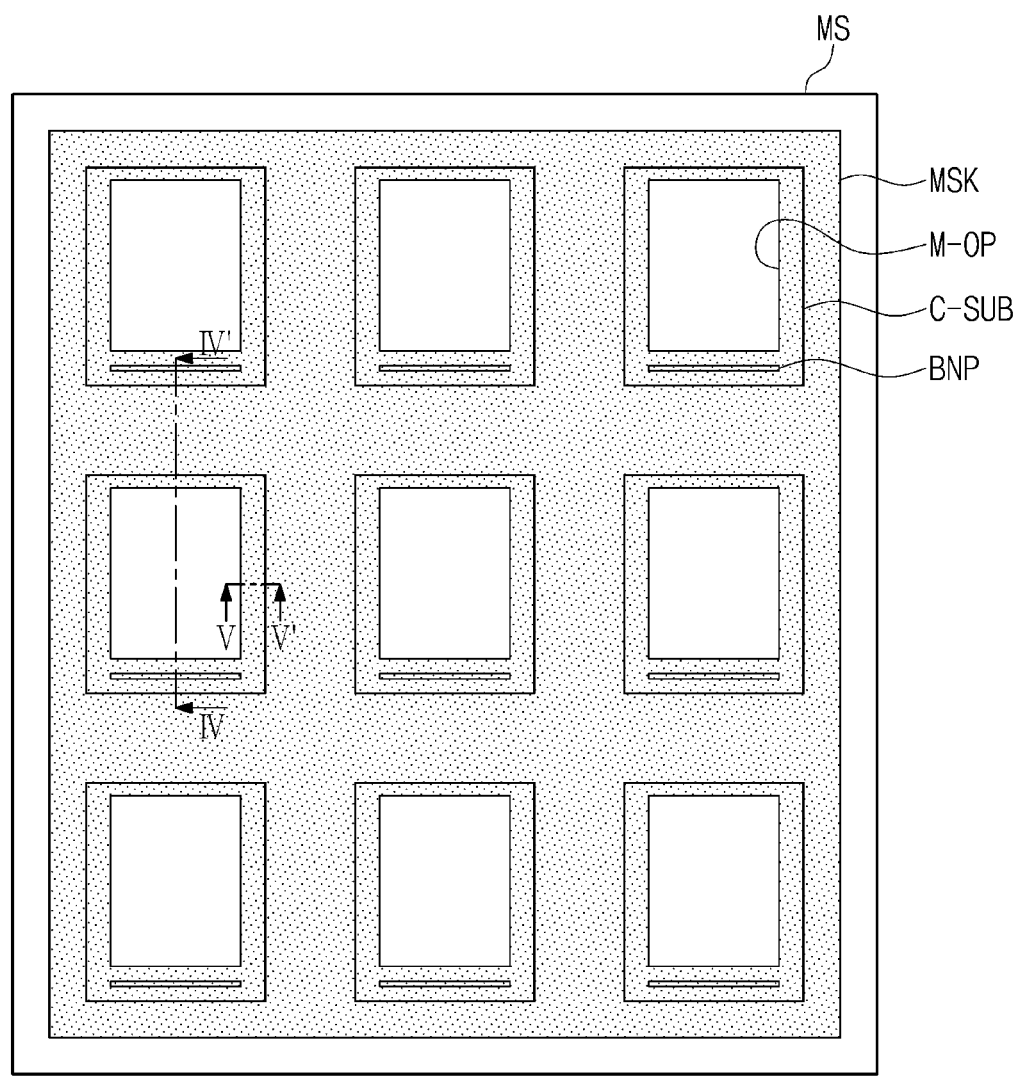
FIG. 10A, FIG. 10B, and FIG. 10C are views illustrating a process of forming a thin film encapsulation layer of FIGS. 8A to 9B.
Figure 10B:
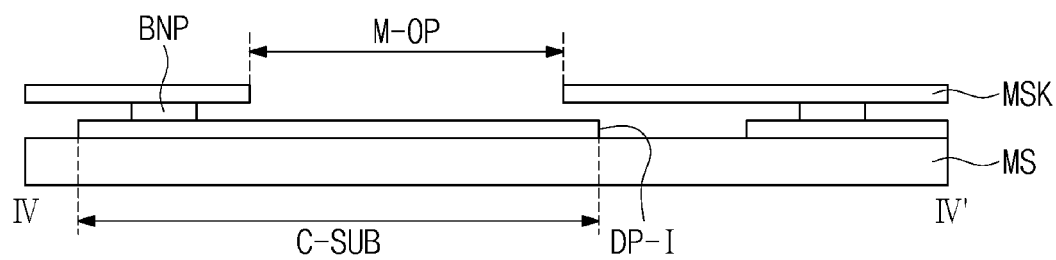
Figure 10C:
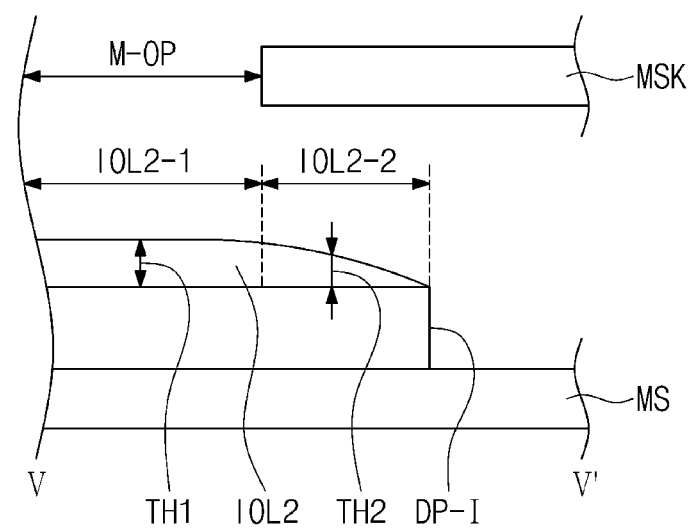

FIGS. 9A and 9B are plan views illustrating a process of manufacturing the display module DM according to an exemplary embodiment of the inventive concept. FIGS. 10A to 10C are views illustrating a process of forming the thin film encapsulation layer TFE of FIGS. 8A and 9B.

FIG. 9A is a plan view illustrating edges of the second intermediate inorganic layer 20, the intermediate organic layer 30, the outer organic layer 30-0, and the second encapsulation inorganic layer IOL2, which are described with reference to FIGS. 8A to 8C. Although not separately shown, the first intermediate inorganic layer 10 may have substantially the same shape as the second intermediate inorganic layer 20 on a plane. The first encapsulation inorganic layer IOL1 and the second encapsulation inorganic layer IOL2 may have substantially the same shape on the plane. The edge of the encapsulation organic layer OL may have a shape corresponding to that of the first protrusion part DMP. The buffer layer BFL may have the same shape as the base layer SUB.

The second intermediate inorganic layer 20 overlaps the display area DA and the non-display area NDA. The edge of the second intermediate inorganic layer 20 may have a shape similar to that of the base layer SUB. The second intermediate inorganic layer 20 is disposed inside the edge of the base layer SUB and also disposed adjacent to edge of the base layer SUB.

The intermediate organic layer 30 overlaps the display area DA and the non-display area NDA. The intermediate organic layer 30 is disposed inside the second intermediate inorganic layer 20. That is, the edge of the intermediate organic layer 30 is disposed inside the edge of the second intermediate inorganic layer 20. The edge of the intermediate organic layer 30 is disposed adjacent to a boundary between the display area DA and the non-display area NDA. Thus, the intermediate organic layer 30 exposes a portion of the second intermediate inorganic layer 20 within the non-display area NDA. The intermediate organic layer 30 may expose an edge portion of the second intermediate inorganic layer 20 within the non-display area NDA.

The outer organic layer 30-0 is connected to the second protrusion part BNP, spaced apart from the intermediate organic layer 30, and disposed between the display area DA and the pad area NDA-PD. The outer organic layer 30-0 exposes a portion of the second intermediate inorganic layer 20 within the non-display area NDA.

The second encapsulation inorganic layer IOL2 overlaps the display area DA and the non-display area NDA. As illustrated in FIG. 9B, the second encapsulation inorganic layer IOL2 may include a first region IOL2-1 overlapping the display area DA and a second region IOL2-2 overlapping the non-display area NDA. The first region IOL2-1 may further overlap the non-display area NDA, and the second region IOL2-2 may not overlap the display area DA.

The second region IOL2-2 is thinner than the first region IOL2-1. Also, the second region IOL2-2 has a film density lower than that of the first region IOL2-1. As described below, this is done because the second encapsulation inorganic layer IOL2 is deposited by using an open-type mask. Although not separately shown, the first encapsulation inorganic layer IOL1 may also have a first region and a second region having a thickness less than that of the first region. This is done because the first and second encapsulation inorganic layers IOL1 and IOL2 are formed by using the same mask.

FIGS. 10A to 10C are views illustrating a process of forming the thin film encapsulation layer TFE of FIGS. 8A and 8B.

As illustrated in FIG. 10A, the same process is performed on a plurality of cell areas C-SUB defined on a mother substrate MS, and the display module DM is formed on each of the plurality of cell areas C-SUB. After the manufacturing process is completed, the mother substrate MS is cut to separate the display modules DM from each other.

The first encapsulation inorganic layer IOL1, the encapsulation organic layer OL, and the second encapsulation inorganic layer IOL2, which are illustrated in FIGS. 8A and 8C, are successively formed. Here, the encapsulation organic layer OL is formed in the above-described inject manner. The first encapsulation inorganic layer IOL1 and the second encapsulation inorganic layer IOL2 are formed through a deposition process that will be described below. The second encapsulation inorganic layer IOL2 will be mainly described below.

As illustrated in FIGS. 10A and 10B, a mask MSK in which a plurality of openings M-OP are defined is aligned with the mother substrate MS. Each of the openings M-OP may correspond to the display area DA illustrated in FIGS. 9A and 9B. The mother substrate MS with which the mask MSK is aligned is disposed in a deposition chamber, and then, an inorganic material is deposited on the mother substrate MS.

The display module DP-1 of FIG. 10B has a configuration that is formed up to the display device layer DP-OLED of the display panel DP of FIG. 2. The mask MSK is supported by the second protrusion part BNP. Since a gap is maintained between the mask MSK and the display module DP-1, the inorganic material is deposited on an area greater than that of the opening M-OP. That is, the inorganic material is deposited on the non-display area NDA as well as the display area DA. Thus, the second encapsulation inorganic layer IOL2 having the configuration illustrated in FIG. 9B is formed.

As illustrated in FIG. 10C, since the second region IOL2-2 of the second encapsulation inorganic layer IOL2 overlaps the mask MSK, an amount of inorganic material may be relatively lower. Thus, the second region IOL2-2 has a thickness TH2 less than a thickness TH1 of the first region IOL2-1. The second thickness TH2 of the second region IOL2-2 may gradually decrease in a direction that is away from the first region IOL2-1. That is, the second thickness TH2 of the second region IOL2-2 becomes smaller as a distance from the first region IOL2-1 increases. Also, the second region IOL2-2 has a density lower than that of the first region IOL2-1. This is done because ashing gases used for removing organic residues before the encapsulation inorganic layer is deposited exist around the mask MSK to restrict the deposition.

The second region IOL2-2 having a thin thickness and the lower film density may be relatively week in coupling force with respect to the lower layer when compared to the first region IOL2-1. Particularly, when the lower layer is the organic layer, moisture may be penetrated through an interface between the inorganic layer and the organic layer, and thus, the inorganic layer may be delaminated. Since the intermediate organic layer 30 or the pixel defining layer PDL, which is the inorganic layer, is disposed on a lower portion of the first encapsulation inorganic layer IOL1, the second encapsulation inorganic layer IOL2 may be more easily delaminated.

According to an exemplary embodiment of the inventive concept, to prevent the inorganic layer from be delaminated, the inorganic touch layer contacts the second intermediate inorganic layer 20 exposed by the intermediate organic layer 30 within the non-display area NDA. Hereinafter, this will be described in more detail with reference to FIGS. 11A and 11B.

Figure 11A:
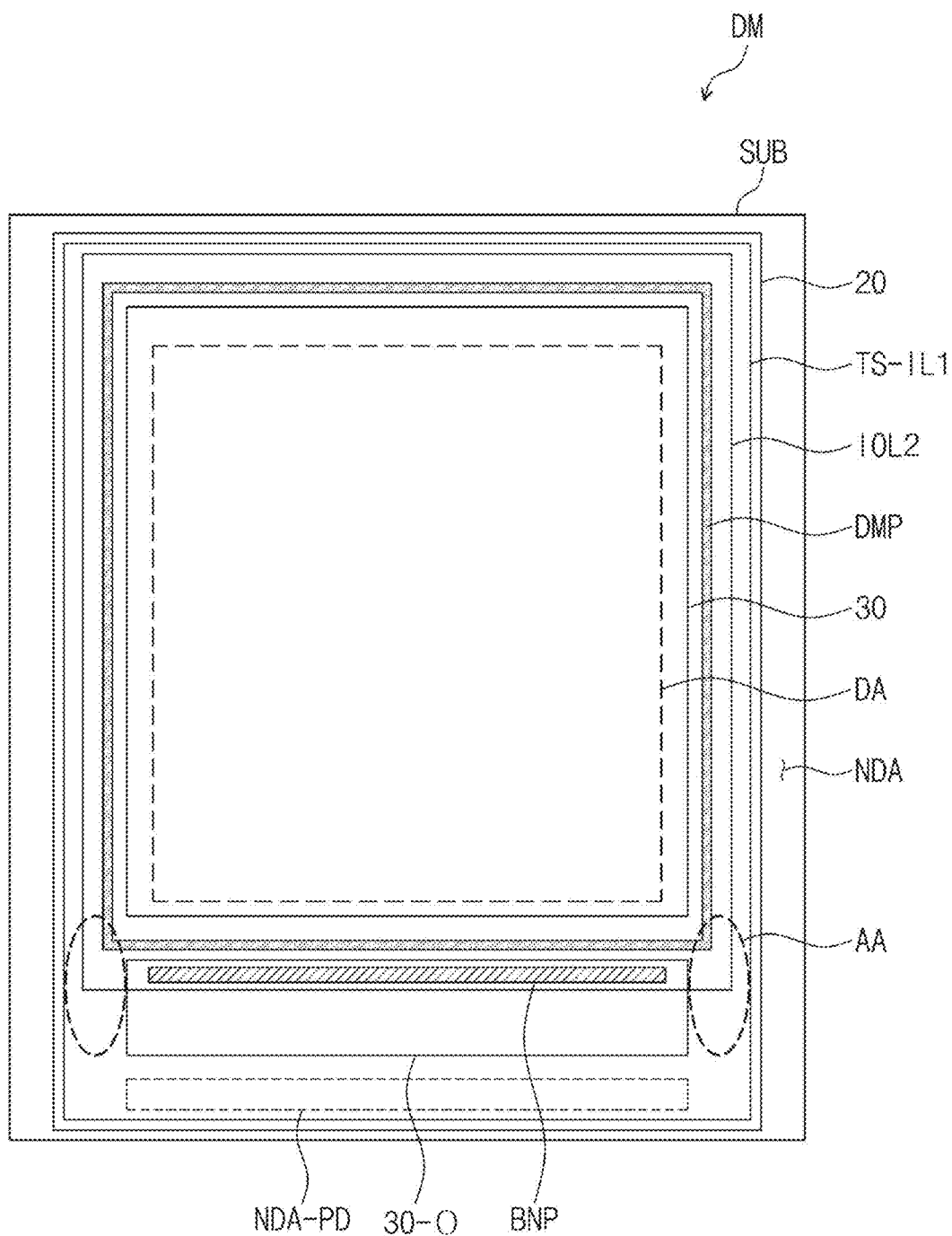
FIG. 11A and FIG. 11B are plan views comparing the display module according to an exemplary embodiment to a display module according to Comparative Example.
Figure 11B:
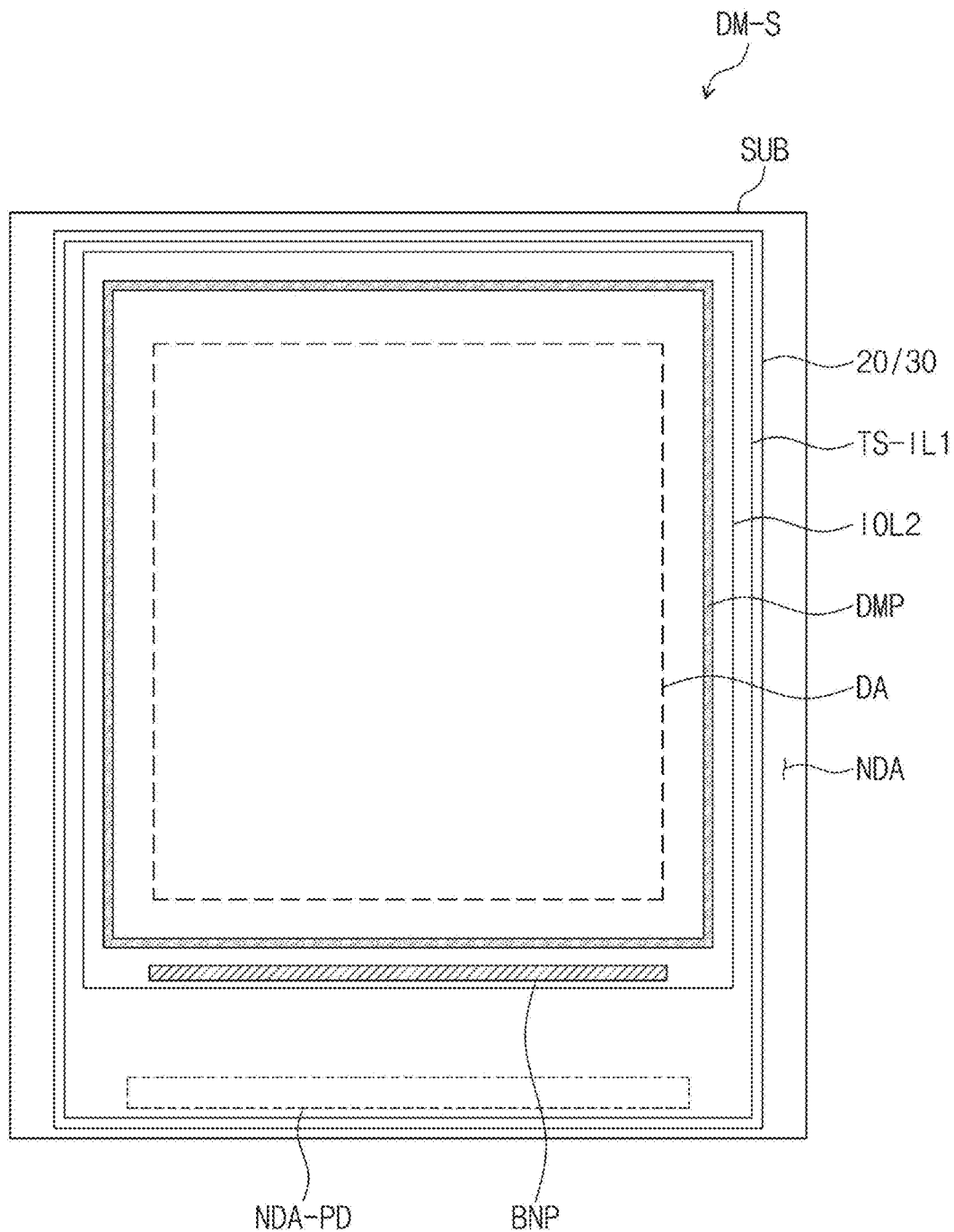

FIGS. 11A and 11B are plan views comparing the display module DM according to an exemplary embodiment of the inventive concept to a display module DM-S according to Comparative Example.

According to the exemplary embodiment of FIG. 11A, the inorganic touch layer TS-IL1 contacts the second intermediate inorganic layer 20 exposed by the intermediate organic layer 30 within the non-display area NDA. A corner area AA of the second encapsulation inorganic layer IOL2 is expressed by dotted lines. The second encapsulation inorganic layer IOL2 contacts the inorganic touch layer TS-IL1 on the corner area AA. Since the inorganic touch layer TS-IL1 contacts the second intermediate inorganic layer 20 on the corner area AA, the second encapsulation inorganic layer IOL2 disposed between the inorganic touch layer TS-IL1 and the second intermediate inorganic layer 20 may be sealed to block a penetration path of the moisture, which is expressed by an arrow.

In addition, the inorganic touch layer TS-IL1 contacts the second intermediate inorganic layer 20 along an edge of the display area DA. The second encapsulation inorganic layer IOL2 is sealed along the edge of the display area DA. The inorganic touch layer TS-IL1 and the second intermediate inorganic layer 20 contact each other within the pad area NDA-PD.

An edge of the inorganic touch layer TS-IL1 may be disposed inside an edge of the second intermediate inorganic layer 20. An edge of the outer organic layer 30-0 is disposed inside the edge of the inorganic touch layer TS-IL1. The inorganic touch layer TS-IL1 may contact a portion of the second intermediate inorganic layer 20 exposed from the outer organic layer 30-0 within the non-display area NDA. The second intermediate inorganic layer 20 and the inorganic touch layer TS-IL1 may contact each other on the pad area NDA-PD.

According to Comparative Example of FIG. 11B, an intermediate organic layer 30 has substantially the same shape as a second intermediate inorganic layer 20 in plan view. Since a inorganic touch layer TS-IL1 is disposed on the intermediate organic layer 30, the inorganic touch layer TS-IL1 does not contact the second intermediate inorganic layer 20. The moisture penetrated in the arrow direction delaminates the encapsulation inorganic layer. Particularly, a second region of the encapsulation inorganic layer having a lower film density may be delaminated.

According to the exemplary embodiment, defects due to the moisture may be reduced when compared to the display module DM-S according to Comparative Example. As described above, this is done because the display panel DP includes the patterned organic layer, and the inorganic layer of the touch sensing layer TS contacts the exposed portion of the inorganic layer of the display panel DP.

Figure 12A:
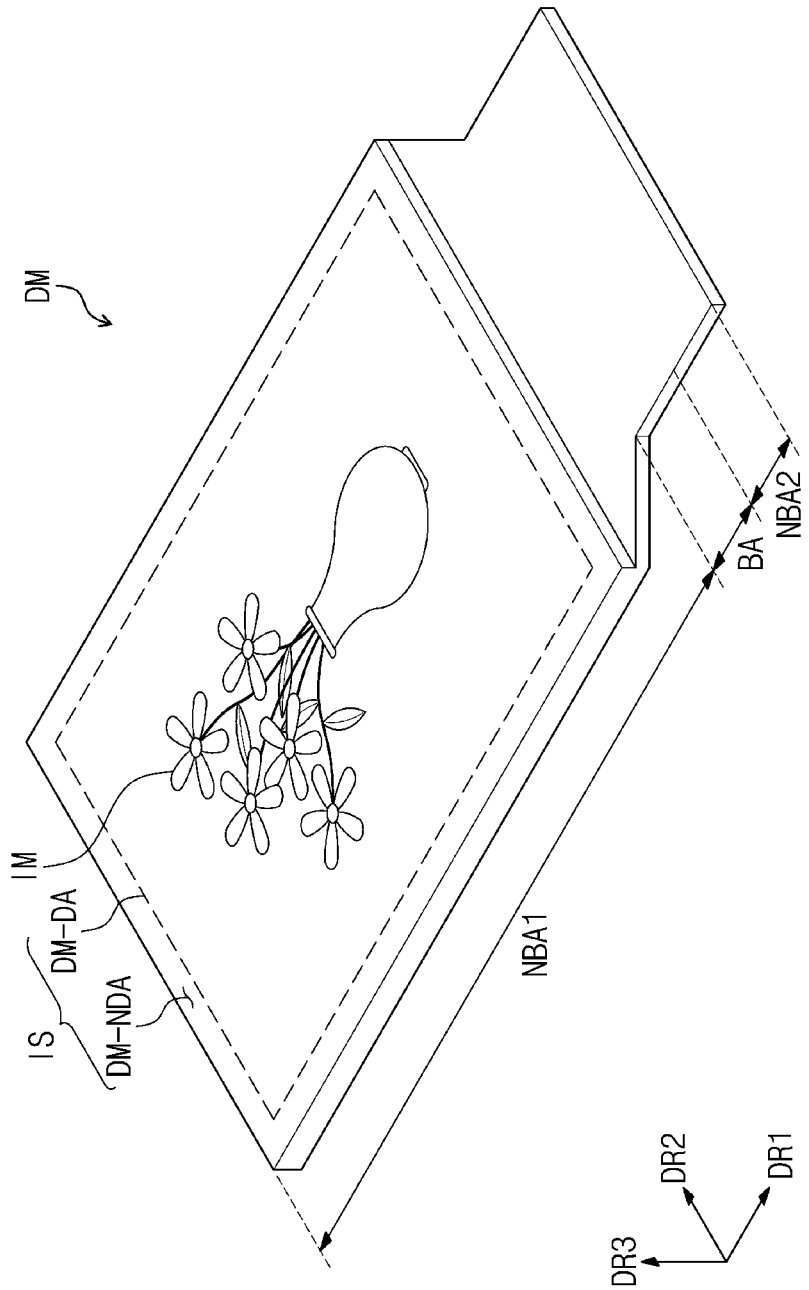
FIG. 12A and FIG. 12B are perspective views of a display module according to an exemplary embodiment.
Figure 12B:
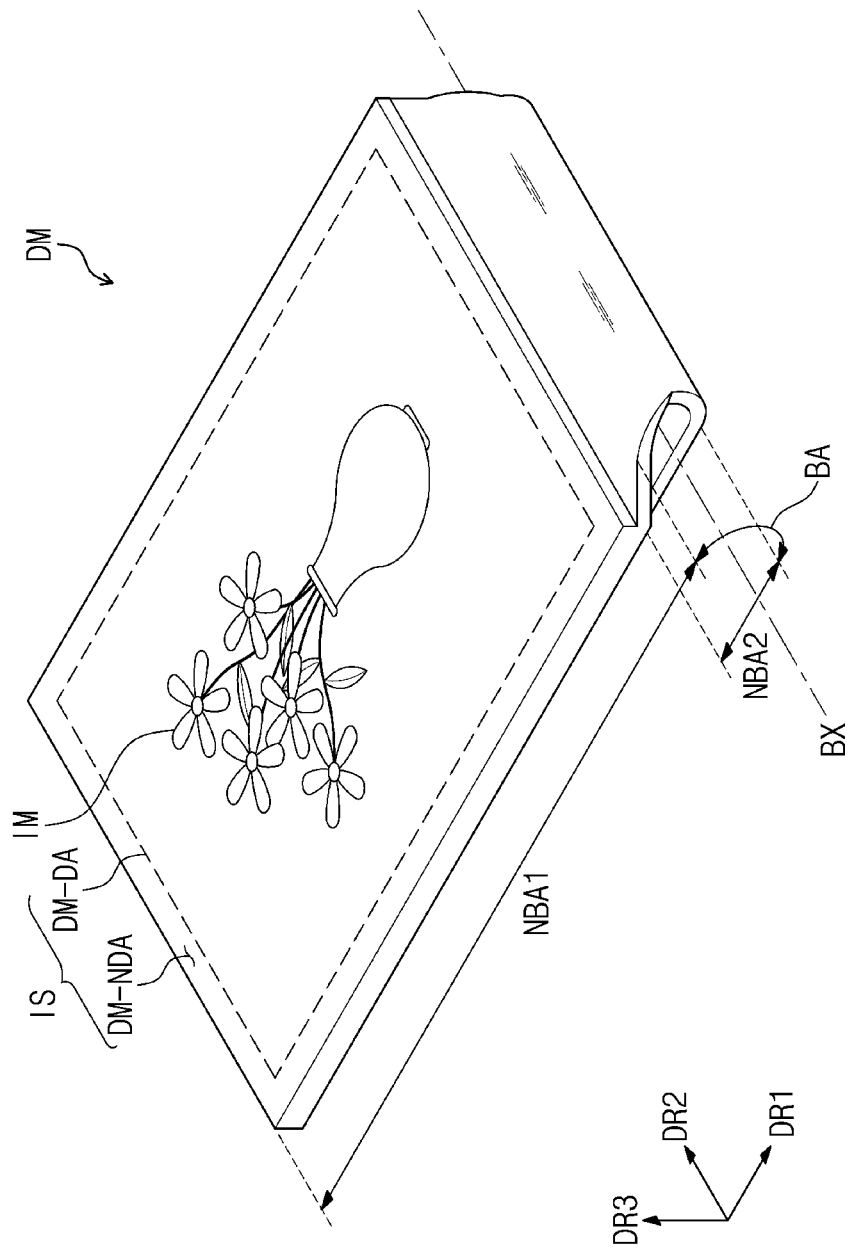
Figure 13:
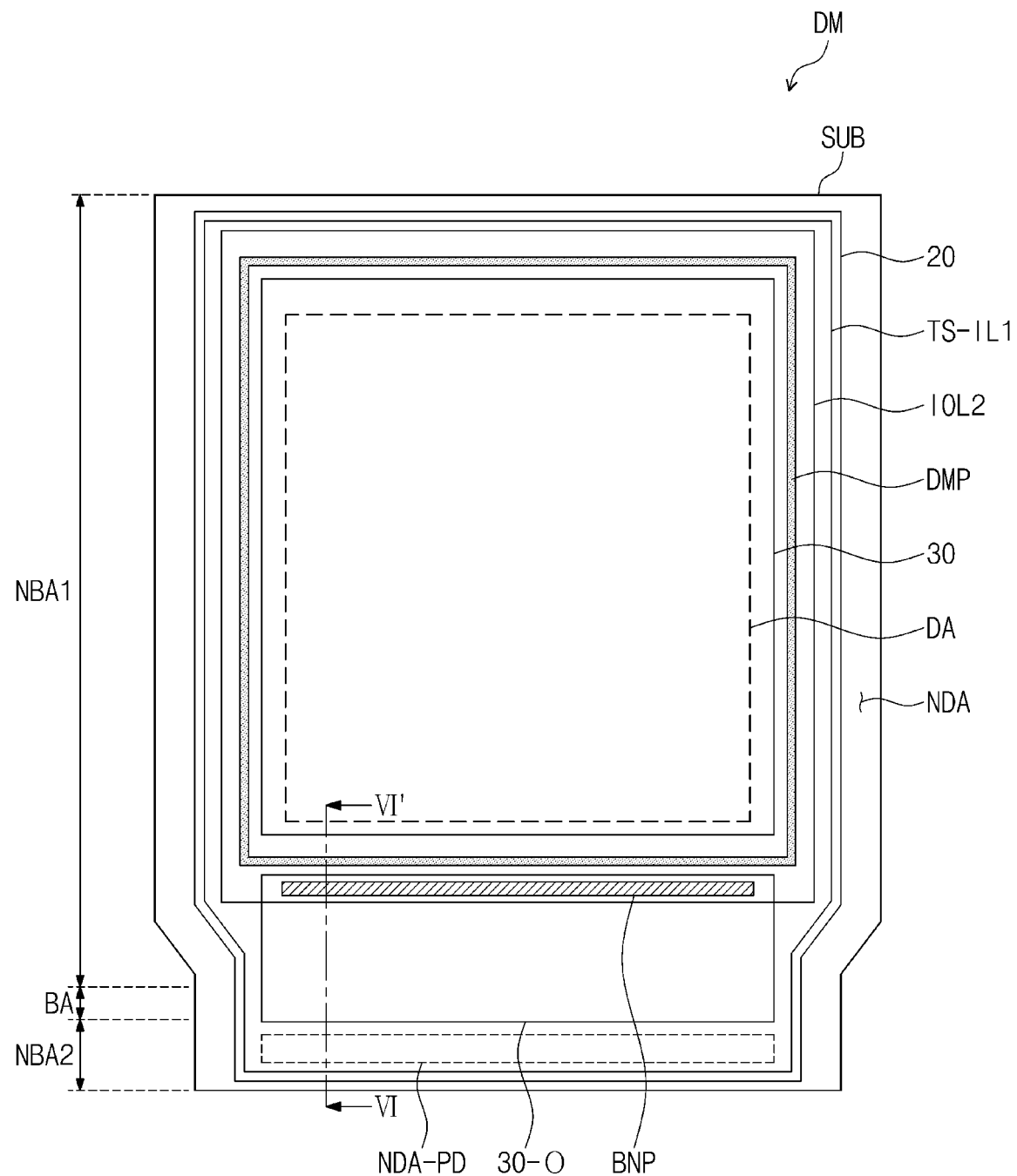
FIG. 13 is a plan view of the display module according to an exemplary embodiment.
Figure 14:
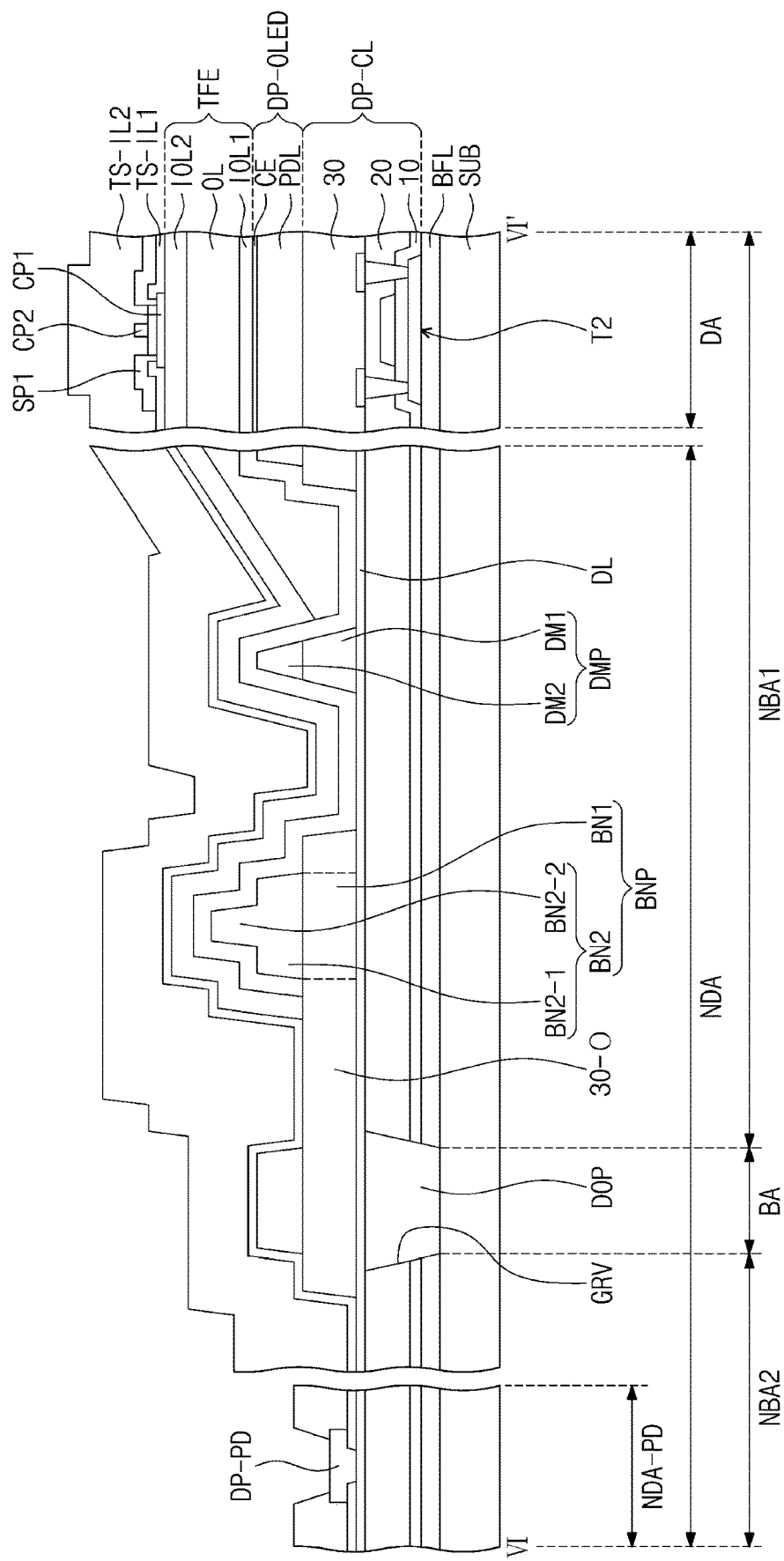
FIG. 14 is a cross-sectional view of the display module according to an exemplary embodiment.

FIGS. 12A and 12B are perspective views of a display module DM according to an exemplary embodiment of the inventive concept. FIG. 13 is a plan view of the display module DM according to an exemplary embodiment of the inventive concept. FIG. 14 is a cross-sectional view of the display module DM according to an exemplary embodiment of the inventive concept taken along line VI-VI' in FIG. 13. Hereinafter, detailed descriptions with respect to the same constituent as that described with reference to FIGS. 1 to 11B will be omitted.

As illustrated in FIGS. 12A and 12B, the display module DM includes a first non-bending area NBA1, a second non-bending area NBA2 spaced apart from the first non-bending area NBA1 in the first direction DR1, and a bending area BA defined between the first non-bending area NBA1 and the second non-bending area NBA2. A display area DA may be included in the first non-bending area NBA1. Portions of a non-display area NDA respectively correspond the second non-bending area NBA2 and the bending area BA, and a portion of the non-display area NDA, which is adjacent to the display area DA, is included in the first non-bending area NBA1.

The bending area BA may be bent so that a bending axis BX is defined along the second direction DR2 perpendicular to the first direction DR1. The second non-bending area NBA2 faces the first non-bending area NBA1. Each of the bending area BA and the second non-bending area NBA2 may have a width in the second direction DR2, which is less than that of the first non-bending area NBA1. Although not separately shown, the display module DM of FIG. 1 may also include a bending area corresponding to the bending area BA.

As illustrated in FIG. 13, although the bending area BA is provided, the same plane structure as that of FIG. 11A may be provided. Thus, a penetration path of moisture as expressed by an arrow of FIG. 11A may be blocked. This is done because a inorganic touch layer TS-IL1 contacts a portion of a second intermediate inorganic layer 20 exposed from an organic layer of a display panel DP within the non-display area NDA.

As illustrated in FIG. 14, a groove GRV through which the non-display area NDA of a base layer SUB is bent may be defined in each of a buffer layer BFL and the intermediate inorganic layers 10 and 20. A dummy organic pattern DOP may be disposed inside the groove GRV. Since the inorganic layer is removed from the bending area BA, stress of the bending area BA may be reduced, and thus cracks of the intermediate inorganic layers 10 and 20 may be prevented from occurring.

Figure 15:
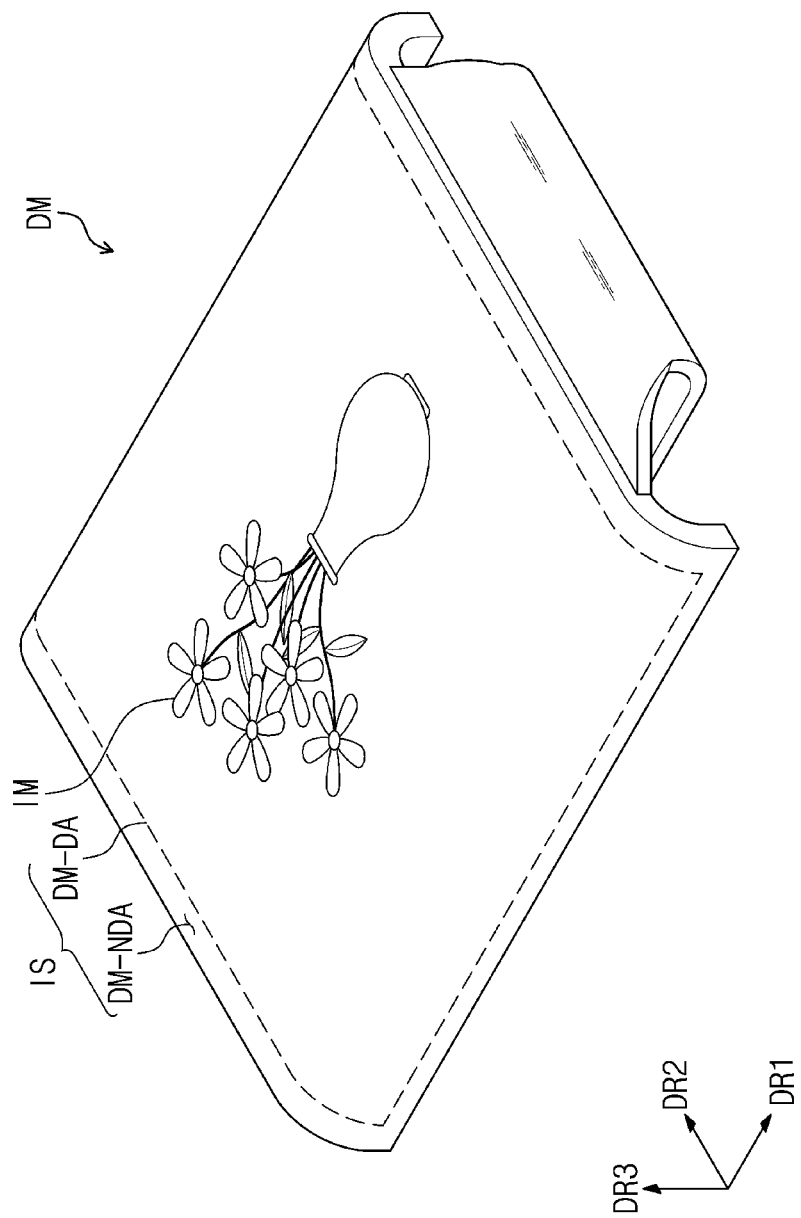
FIG. 15 is a perspective view of a display device according to an exemplary embodiment.
Figure 16:
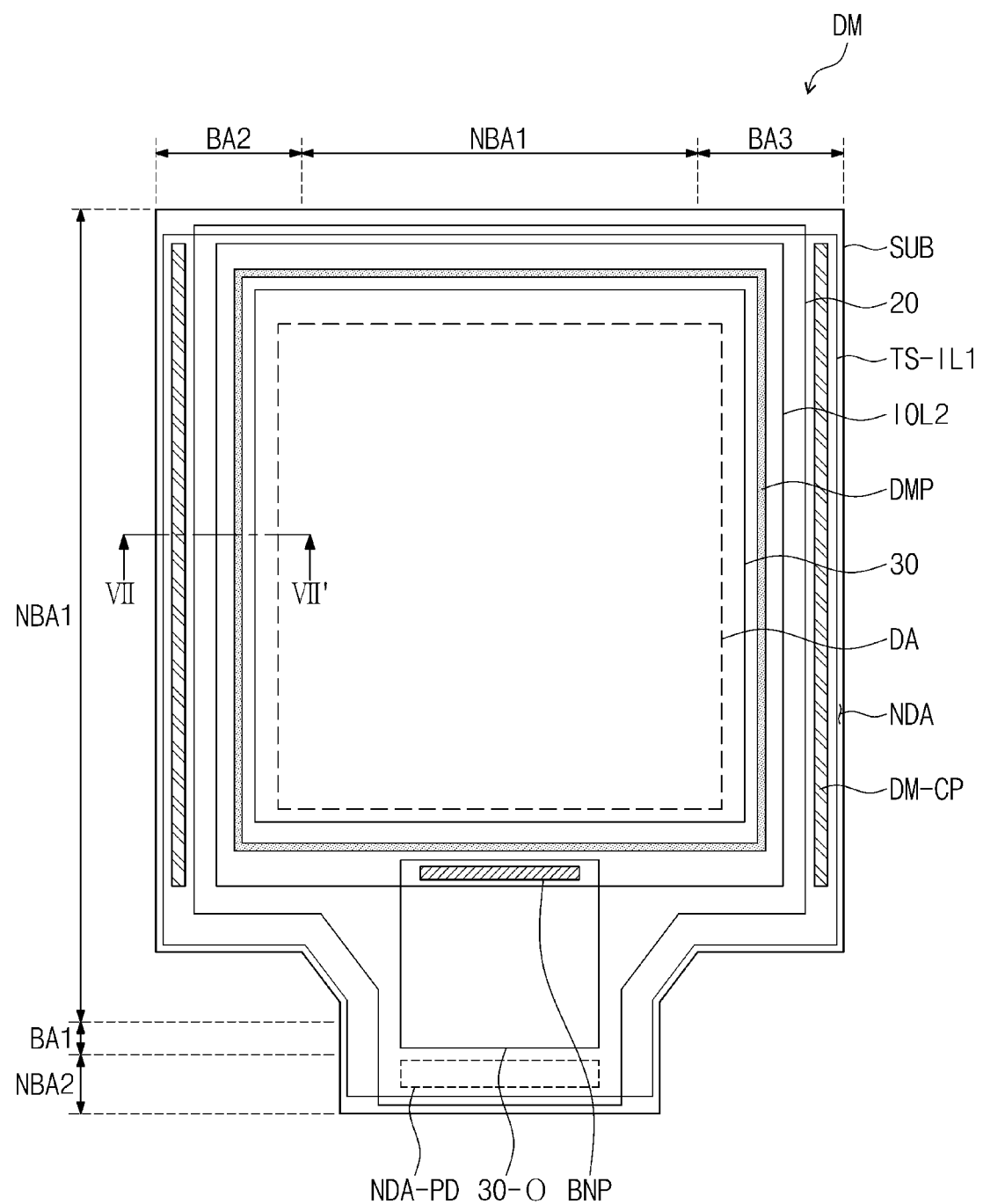
FIG. 16 is a plan view of the display module according to an exemplary embodiment.
Figure 17:
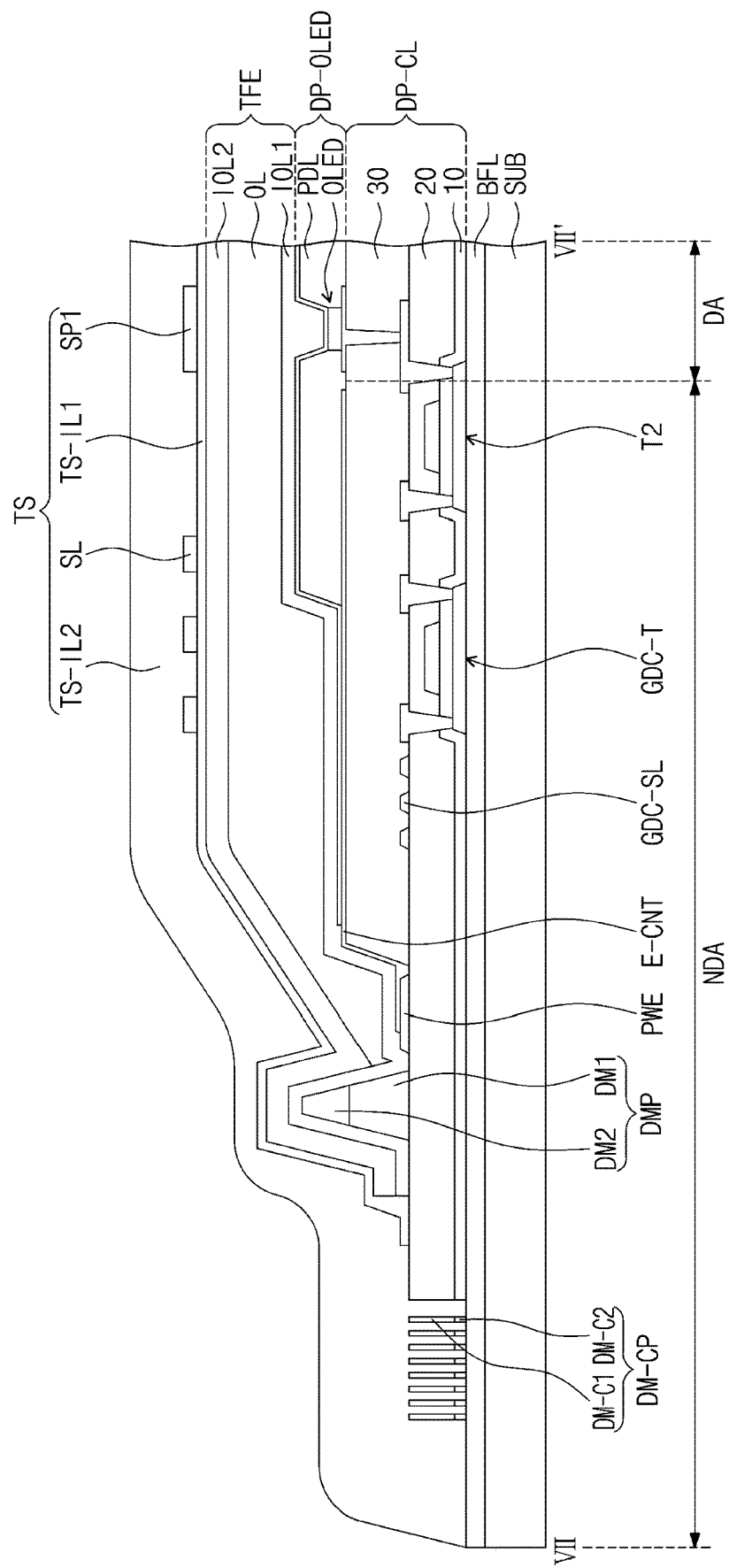
FIG. 17 is a cross-sectional view of the display module according to an exemplary embodiment.

FIG. 15 is a perspective view of a display module DM according to an exemplary embodiment of the inventive concept. FIG. 16 is a plan view of the display module DM according to an exemplary embodiment of the inventive concept. FIG. 17 is a cross-sectional view of the display module DM according to an exemplary embodiment of the inventive concept taken along line VII-VII' in FIG. 16. Hereinafter, detailed descriptions with respect to the same constituent as that described with reference to FIGS. 1 to 13 will be omitted.

As illustrated in FIGS. 15 and 16, the display module DM may include a first non-bending area NBA1, a second non-bending area NBA2, a first bending area BA1, a second bending area BA2, and a third bending area BA3. The display module DM may further include the second bending area BA2 and the third bending area BA3 when compared to the display module DM of FIGS. 12A and 12B.

The second bending area BA2 and the third bending area BA3 are spaced apart from each other in the second direction DR2 with the first non-bending area NBA1 therebetween. Each of the second bending area BA2 and the third bending area BA3 may have a curvature radius greater than that of the first bending area BA1. A pixel PX (see FIG. 3) may be disposed on a portion of each of the second and third bending areas BA2 and BA3.

As illustrated in FIGS. 16 and 17, inorganic material lines DM-CP disposed outside an edge of an intermediate organic layer 30 and extending along the edge of the intermediate organic layer 30 may be disposed on the second and third bending areas BA2 and BA3.

The inorganic material lines DM-CP may be spaced apart from each other in the second direction DR2 and extend in the first direction DR1. Each of the inorganic material lines DM-CP may include a first layer DM-C1 and a second layer DM-C2. The second layer DM-C2 may have the same thickness as the first intermediate inorganic layer 10 and include the same material as the first intermediate inorganic layer 10. The first layer DM-C1 may have the same thickness as the second intermediate inorganic layer 20 and include the same material as the second intermediate inorganic layer 20.

A inorganic touch layer TS-IL1 may be spaced apart from the inorganic material lines DM-CP. A touch organic layer TS-IL2 may overlap the inorganic material lines DM-CP. The touch organic layer TS-IL2 may contact the inorganic material lines DM-CP. The touch organic layer TS-IL2 may contact a buffer layer BFL that are positioned under the inorganic material lines DM-CP.

When an external impact is applied to an edge of the display module DM, the inorganic material lines DM-CP may be broken to absorb the impact. The touch organic layer TS-IL2 may stop an occurrence of cracks of the inorganic material lines DM-CP and prevent the cracks from being expanded to an occurrence of cracks of other components.

As described above, although the encapsulation inorganic layer includes the second region having the low film density, the encapsulation inorganic layer may not be delaminated. This is done because the inorganic layer of the touch sensing layer is directly deposited on the inorganic layer of the display panel to compress the encapsulation inorganic layer between the inorganic layers. In addition, the inorganic layer of the touch sensing layer may be directly deposited on the inorganic layer of the display panel to block the permeation path of moisture.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claims is:

1. A display device comprising:
   a base layer comprising a display area and a non-display area disposed outside the display area;
   an intermediate inorganic layer disposed on the base layer and overlapping the display area and the non-display area;
   an intermediate organic layer disposed on the intermediate inorganic layer to expose a portion of the intermediate inorganic layer within the non-display area in a plan view;
   a light emitting diode disposed on the intermediate organic layer and overlapping the display area;
   a thin film encapsulation layer disposed on the light emitting diode and comprising a first encapsulation inorganic layer, an encapsulation organic layer on the first encapsulation inorganic layer, and a second encapsulation inorganic layer on the encapsulation organic layer, at least one of the first encapsulation inorganic layer and the second encapsulation inorganic layer comprising a first region overlapping the display area and a second region overlapping the non-display area and having a thickness less than that of the first region;
   a first inorganic layer is disposed on the thin film encapsulation layer;
   an electrode disposed on the first inorganic layer; and
   a second inorganic layer on the first inorganic layer and overlapping the display area and the non-display area,
   one of the first inorganic layer or the second inorganic layer contacts the portion of the intermediate inorganic layer exposed by the intermediate organic layer.

2. The display device of claim 1, wherein an edge of the intermediate organic layer is disposed inside an edge of the intermediate inorganic layer in a plan view.

3. The display device of claim 1, wherein the thickness of the second region becomes smaller as a distance from the first region increases.

4. The display device of claim 1, further comprising a protrusion part disposed outside an edge of the intermediate organic layer and extending along the edge of the intermediate organic layer.

5. The display device of claim 4, wherein the protrusion part surrounds the edge of the intermediate organic layer.

6. The display device of claim 4, further comprising signal line electrically connected to the light emitting diode and signal pad connected to the signal line, and
   the signal pad is disposed in the non-display area.

7. The display device of claim 4, wherein one of the first inorganic layer or the second inorganic layer overlaps the protrusion part.

8. The display device of claim 1, further comprising an organic layer disposed on the second inorganic layer.

9. The display device of claim 8, wherein an edge of the organic layer is disposed outside an edge of the second inorganic layer in a plan view.

10. The display device of claim 1, wherein the non-display area comprises a first non-bending area, a second non-bending area spaced apart from the first non-bending area in a first direction, and a bending area defined between the first non-bending area and the second non-bending area, and
    the bending area is bent so that a bending axis is defined in a second direction perpendicular to the first direction.

11. The display device of claim 1, wherein the intermediate inorganic layer has a groove through which a portion of the non-display area of the base layer is exposed, and
    a dummy organic pattern is disposed inside the groove.

12. The display device of claim 1, further comprising inorganic material lines disposed outside an edge of the intermediate inorganic layer to extend along the edge of the intermediate inorganic layer.

13. The display device of claim 12, wherein one of the first inorganic layer or the second inorganic layer is spaced apart from the inorganic material lines.

14. The display device of claim 12, further comprising an organic layer disposed on the second inorganic layer, and
    wherein the organic layer overlaps the inorganic material lines.

* * * * *